US012563804B2

(12) United States Patent
Chen et al.

(10) Patent No.: US 12,563,804 B2
(45) Date of Patent: Feb. 24, 2026

(54) SEMICONDUCTOR STRUCTURE AND FORMING METHOD THEREOF

(71) Applicant: TAIWAN SEMICONDUCTOR MANUFACTURING COMPANY LTD., Hsinchu (TW)

(72) Inventors: Jhih-Bin Chen, Hsinchu (TW); Ming Chyi Liu, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 686 days.

(21) Appl. No.: 17/725,426

(22) Filed: Apr. 20, 2022

(65) Prior Publication Data

US 2023/0343850 A1     Oct. 26, 2023

(51) Int. Cl.
| | |
|---|---|
| H10D 64/01 | (2025.01) |
| H10D 64/68 | (2025.01) |
| H10D 84/01 | (2025.01) |
| H10D 84/03 | (2025.01) |

(52) U.S. Cl.
CPC ......... *H10D 64/017* (2025.01); *H10D 64/691* (2025.01); *H10D 84/014* (2025.01); *H10D 84/0142* (2025.01); *H10D 84/038* (2025.01)

(58) Field of Classification Search
CPC ......... H01L 29/66545; H01L 21/82345; H01L 21/823456; H01L 29/517
See application file for complete search history.

(56) References Cited

U.S. PATENT DOCUMENTS

| | | | | |
|---|---|---|---|---|
| 11,211,471 | B1 * | 12/2021 | Tsai | H10D 64/517 |
| 2006/0102962 | A1 * | 5/2006 | Saito | H10D 84/038 |
| | | | | 257/377 |
| 2007/0057331 | A1 * | 3/2007 | Satou | H10D 84/0142 |
| | | | | 257/E21.624 |
| 2007/0075374 | A1 * | 4/2007 | Kudou | H10D 84/0137 |
| | | | | 257/E21.624 |
| 2017/0194209 | A1 * | 7/2017 | Li | H10D 84/0142 |
| 2018/0261507 | A1 * | 9/2018 | Jacobi | H01L 21/28247 |
| 2018/0315752 | A1 * | 11/2018 | Fan | H10D 84/0151 |
| 2020/0058553 | A1 * | 2/2020 | Lim | H10D 64/667 |
| 2020/0176323 | A1 * | 6/2020 | Lo | H10D 84/0142 |
| 2021/0343750 | A1 * | 11/2021 | Lee | H10D 84/0158 |

* cited by examiner

*Primary Examiner* — Fernando L Toledo
*Assistant Examiner* — Marshall Mu-Nuo Hatfield
(74) *Attorney, Agent, or Firm* — WPAT LAW; Anthony King

(57) ABSTRACT

A semiconductor structure and forming method thereof are provided. The semiconductor structure includes a substrate, a gate dielectric, a gate electrode and dielectric structures. The gate dielectric has a top surface aligned with a top surface of the substrate. The gate electrode is disposed over the substrate and overlaps the gate dielectric. The gate electrode has first segments extending in parallel along a direction. The dielectric structures are disposed over the substrate, overlap the gate dielectric and extend in parallel along the direction. The dielectric structures and the first segments are arranged in an alternating pattern.

20 Claims, 20 Drawing Sheets

SEMICONDUCTOR STRUCTURE AND FORMING METHOD THEREOF

BACKGROUND

The semiconductor integrated circuit (IC) industry has experienced exponential growth over the last few decades. As a result of IC evolution, functional density (i.e., the number of interconnected devices per chip area) has generally increased while feature size (i.e., the smallest size of component (or line) that can be created using a fabrication process) has decreased. One advancement implemented as technology nodes shrink, in some IC designs, has been replacement of a polysilicon gate electrode of a logic core with a metal gate electrode and a high-k dielectric, also known as an HKMG replacement gate device, to improve performance of devices having the decreased feature sizes. High-voltage devices are integrated on a same chip with an HKMG logic core, and support the logic core to accomplish an intended function and limit or eliminate inter-chip communication.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
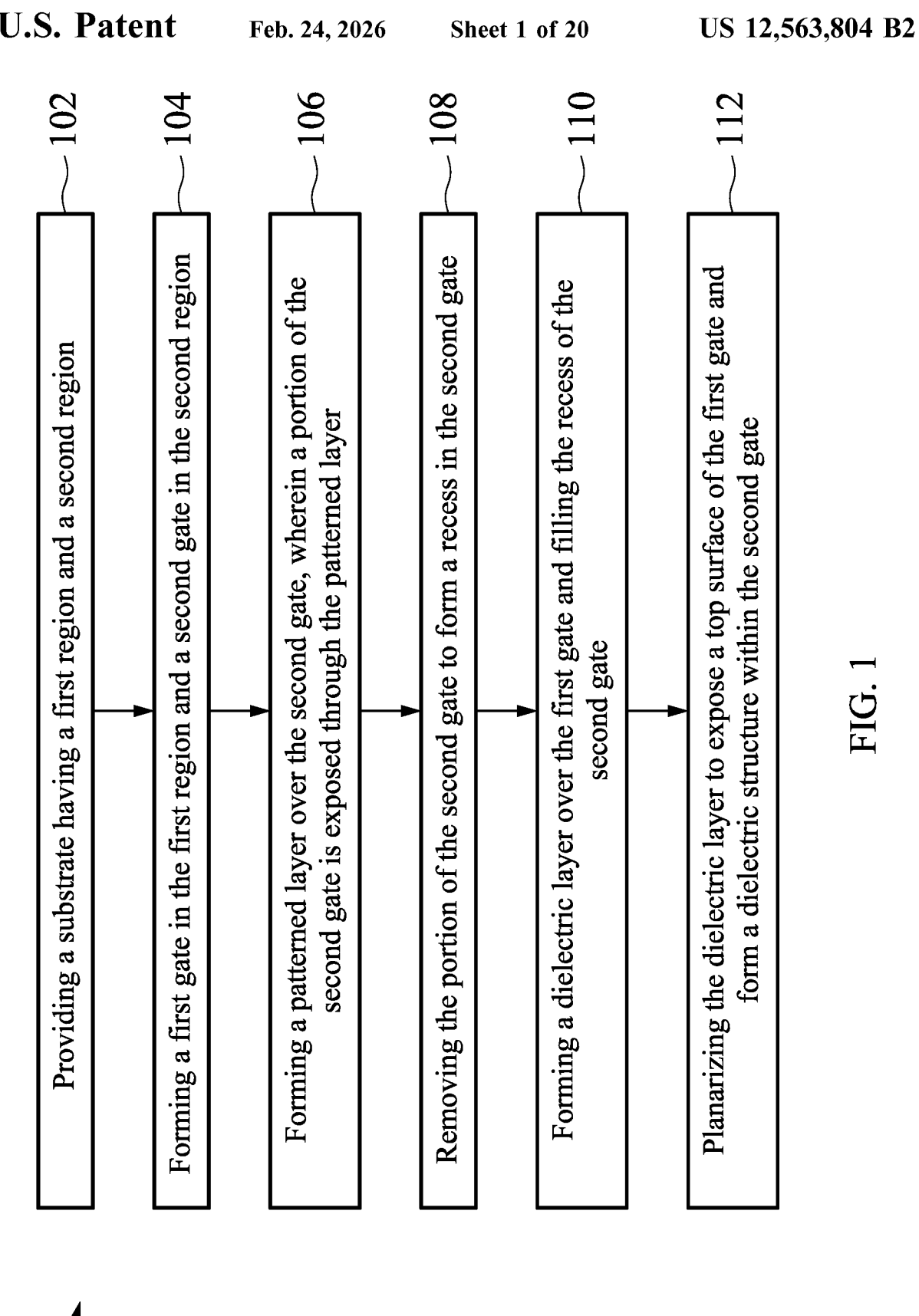
FIG. 1 is a flowchart representing a method for forming a semiconductor structure according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

High-k metal gate (HKMG) technology has become a leading candidate for a next generation of CMOS devices. By combining a metal gate electrode and a high-k dielectric, HKMG technology makes further scaling possible and allows integrated chips to function with reduced power consumption. However, there are challenges to integrating HKMG devices and high-voltage devices. A problem associated with such integrated circuits is occurrence of a dishing effect over a high-voltage region where the high-voltage devices reside when fabricating the integrated circuits through planarization processes (e.g, processes used for planarizing metal gates of low-voltage devices and/or interlayer dielectrics). The dishing effect may degrade performance of the high-voltage devices. Accordingly, an alternative approach to forming a semiconductor structure that integrates the high-voltage device and the low-voltage device is therefore of primary importance.

Some embodiments of the present disclosure provide a semiconductor structure and a forming method thereof that provides one or more improvements over existing approaches. The present disclosure relates to a semiconductor structure that includes a dielectric structure within a high-voltage gate structure and a forming method thereof. By forming the dielectric structure within the high-voltage gate structure as introduced below, structural support may be provided, such that a dishing effect is reduced or eliminated. A device performance may thereby be improved.

FIG. 1 is a flowchart representing a method 100 for forming a semiconductor structure according to aspects of one or more embodiments of the present disclosure. The method 100 for forming the semiconductor structure includes an operation 102, in which a substrate is provided. In some embodiments, the substrate has a first region and a second region. The method 100 further includes an operation 104, in which a first gate is formed in the first region and a second gate is formed in the second region. The method 100 further includes an operation 106, in which a patterned layer is formed over the second gate. In some embodiments, a portion of the second gate is exposed through the patterned layer. The method 100 further includes an operation 108, in which the portion of the second gate is removed to form a recess in the second gate. The method 100 further includes an operation 110, in which a dielectric layer is formed over the first gate and fills the recess of the second gate. The method 100 further includes an operation 112, in which the dielectric layer is planarized to expose a top surface of the first gate and form a dielectric structure within the second gate.

The method is described for a purpose of illustrating concepts of the present disclosure and the description is not intended to limit the present disclosure beyond what is explicitly recited in the claims. Additional operations can be provided before, during, and after the method described above and illustrated in FIG. 1, and some operations described can be replaced, eliminated, or rearranged for additional embodiments of the method.

FIGS. 2 to 10, 12, 14, 16 and 17 are cross-sectional views illustrating a semiconductor structure 200 at different fabrication stages constructed according to aspects of one or more embodiments of the present disclosure.

Figure 2:
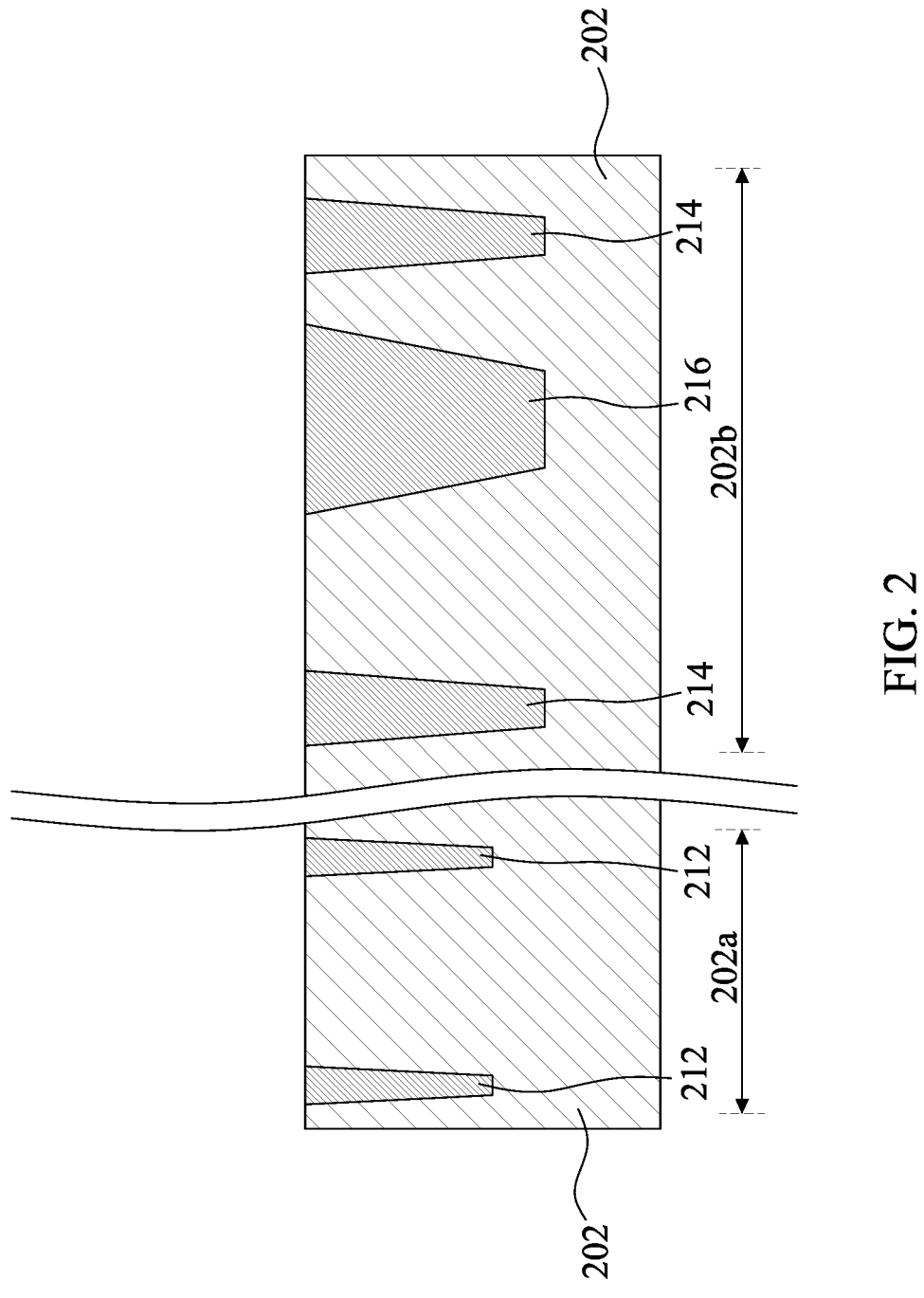
FIGS. 2 to 10, 12, 14, 16 and 17 are cross-sectional views illustrating a semiconductor structure at different fabrication stages constructed according to aspects of one or more embodiments of the present disclosure.

Referring to FIG. 2, in some embodiments, a substrate 202 is provided. The respective step is shown as operation 102 of the method 100 in FIG. 1. The substrate 202 may include a first region 202a and a second region 202b. The first region 202a and the second region 202b may be configured as a low-voltage region 202a and a high-voltage region 202b, respectively. In various embodiments, the substrate 202 may include any type of semiconductor body (e.g., silicon/CMOS bulk, SiGe, SOI, etc.) such as a semiconductor wafer or one or more dies on a wafer, as well as any other type of semiconductor material.

In some embodiments, isolation structures 212, 214 and 216 may be formed within the substrate 202. The isolation structures 212, 214 and 216 may be formed by selectively etching the substrate 202 to form one or more trenches defined by sidewalls of the substrate 202. The trench is subsequently filled with one or more dielectric materials, such as, for example, silicon dioxide, forming the isolation structures 212, 214 and 216. The isolation structures 212, 214 and 216 may be shallow trench isolation (STI) structures or deep trench isolation (DTI) structures. The isolation structures 212, 214 and 216 formed in different regions may have different dimensions. For example, a depth of the isolation structure 212 formed in the first region 202a is less than a depth of the isolation structure 214 or 216 formed in the second region 202b. In some embodiments, a depth of the isolation structure 214 is substantially equal to a depth of the isolation structure 216, but the disclosure is not limited thereto. In some embodiments, a width of the isolation structure 216 is greater than a width of the isolation structure 214. The isolation structures 212, 214 and 216 may include different parameters, depending on the design requirements. The isolation structures 212, 214 and 216 may have upper surfaces substantially aligned with an upper surface of the substrate 202. Alternatively, the isolation structures 212, 214 and 216 may protrude from the substrate 202 and may have upper surfaces at positions higher than the upper surface of the substrate 202.

FIGS. 3 to 9 illustrate a formation of a first gate structure in the first region and a second gate structure in the second region. The respective step is shown as operation 104 of the method 100 in FIG. 1.

Figure 3:
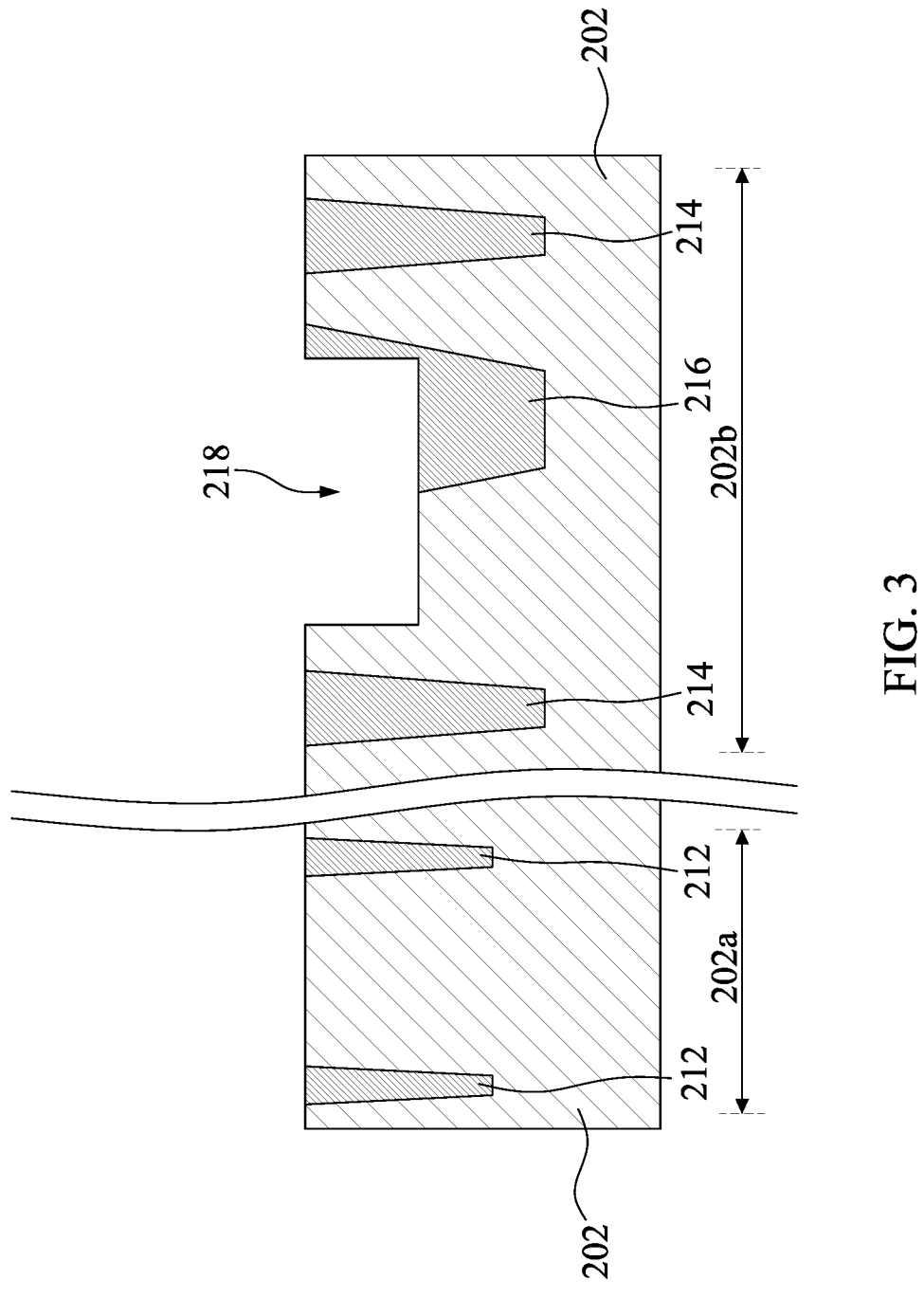

Referring to FIG. 3, in some embodiments, one or more trenches 218 are formed in an upper region of the substrate 202 as gate dielectric trenches in the second region 202b. The trench 218 may be formed by one or more photolithography processes followed by one or more etching processes performed on the substrate 202 between the isolation structures 214 and 216.

Alternatively or additionally, the substrate 202 may then undergo ion implantation to form doped regions (e.g., n-type or p-type regions) between the isolation structures 212, 214 and 216 as device wells, and other doped structures. For example, a first doped region (not shown) is formed between the isolation structures 212 as a low-voltage well. A second doped region (not shown) is formed between the isolation structures 214 and 216 as a high-voltage well. Alternatively or additionally, a deep well region (not shown) is formed in the substrate 202.

Figure 4:
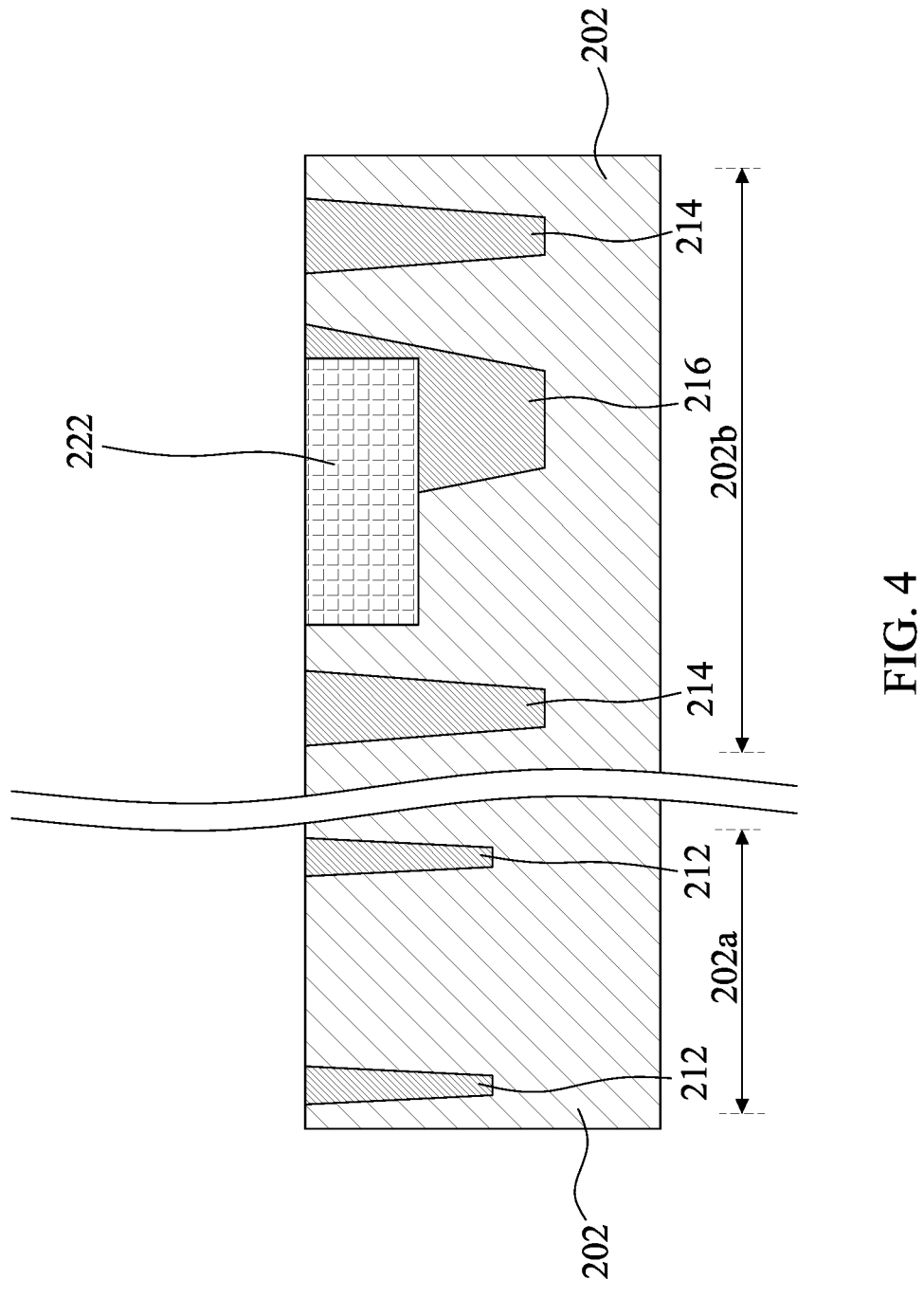

Referring to FIG. 4, in some embodiments, a gate dielectric layer 222 is formed along the trench 218. The gate dielectric layer 222 may fill the trench 218. The gate dielectric layer 222 may be configured as a high-voltage gate dielectric layer. The gate dielectric layer 222 may be formed by one or more thermal processes or deposition processes combined with patterning processes. The gate dielectric layer 222 may be an oxide layer, such as a silicon dioxide layer, but other suitable gate dielectric materials are also applicable. A thickness of the gate dielectric layer 222 depends on applications, ranging from about several or tens of nanometers (nm) for current nodes to several angstroms (Å) for emerging nodes. In some embodiments, the gate dielectric layer 222 may be a multi-layered structure, which may include different gate dielectric materials. In some embodiments, an upper surface of the gate dielectric layer 222 may be aligned with (or substantially coplanar with) an upper surface of the substrate 202. In some alternative embodiments, the upper surface of the gate dielectric layer 222 may be aligned with an upper surface of the isolation structure 216.

Figure 5:
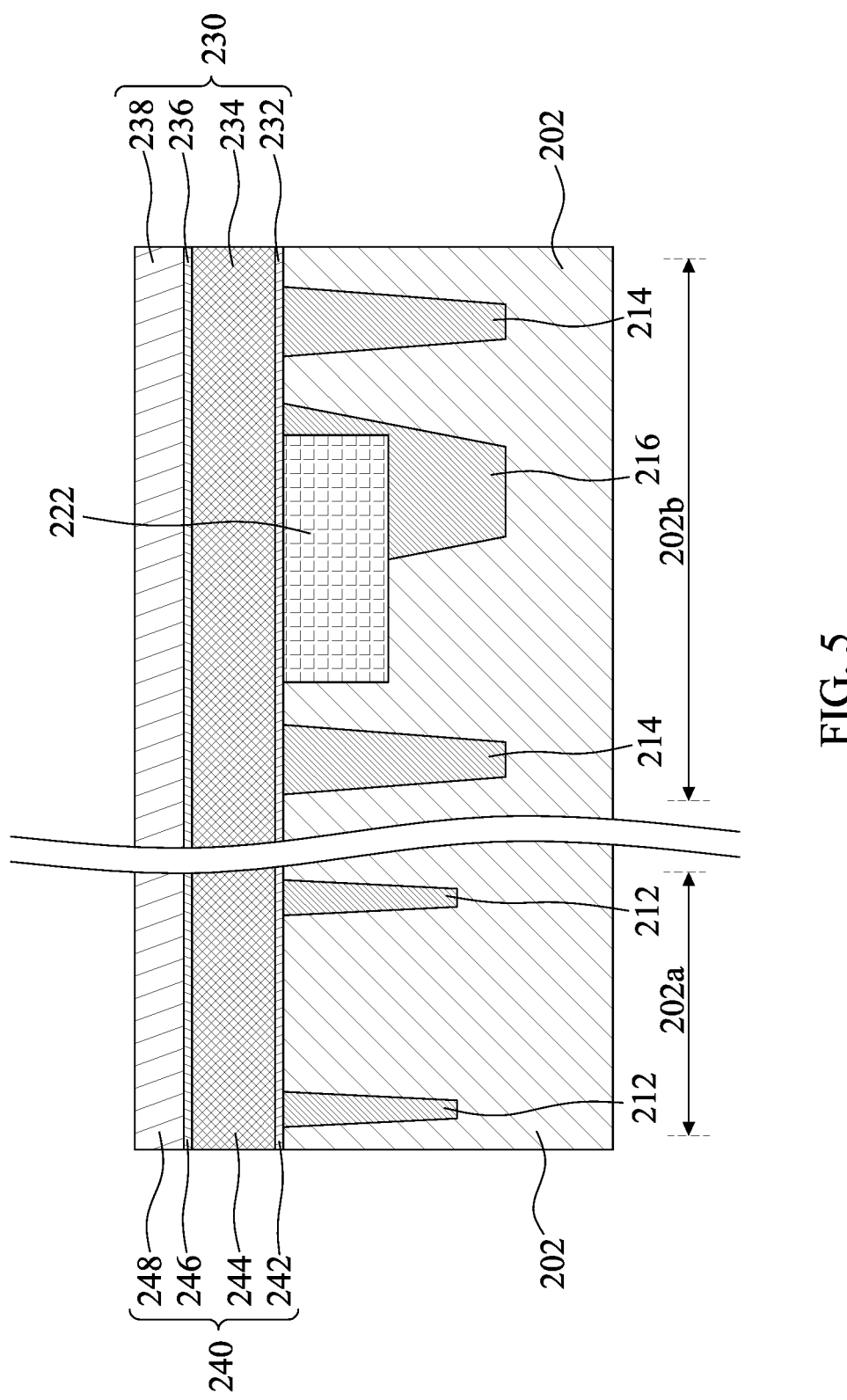

FIG. 5 illustrates a formation of a precursor layer 230 in the second region 202b. In some embodiments, the precursor layer 230 is formed through one or more deposition processes (e.g., chemical vapor deposition, physical vapor deposition, etc.). The precursor layer 230 may include a stack of different materials formed by deposition techniques.

In some embodiments, the precursor layer 230 may be configured as a high-voltage gate precursor layer. In some embodiments, the precursor layer 230 may include a gate dielectric layer 232 (e.g., an interfacial layer (IL), a high-k dielectric layer, and a barrier layer (e.g., titanium nitride) stacked in that order), a gate electrode layer 234, and one or more hard mask layers 236 and 238 (e.g., a silicon dioxide layer 238 stacked on a silicon nitride liner 236, or one or more stacked silicon nitride and silicon dioxide layers). The gate dielectric layer 232 and the gate electrode layer 234 may respectively be configured as a high-voltage gate dielectric layer and a high-voltage gate electrode layer.

FIG. 5 further illustrates a formation of a precursor layer 240 in the first region 202a. In some embodiments, the precursor layer 240 is formed through one or more deposition processes. The precursor layer 240 may include a stack of different materials formed by deposition techniques. In some embodiments, the precursor layer 240 may be configured as a low-voltage gate precursor layer or a sacrificial gate precursor layer. In some embodiments, the precursor layer 240 may include a gate dielectric layer 242 (e.g., an interfacial layer (IL), a high-k dielectric layer, and a barrier layer (e.g., titanium nitride) stacked in that order), a gate electrode layer 244, and one or more hard mask layers 246 and 248 (e.g., a silicon dioxide layer 248 stacked on a silicon nitride liner 246, or one or more stacked silicon nitride and silicon dioxide layers). The gate dielectric layer 242 and the gate electrode layer 244 may respectively be configured as a low-voltage gate dielectric layer (or a sacrificial gate dielectric layer) and a low-voltage gate electrode layer (or a sacrificial gate electrode layer). In some embodiments, the precursor layers 230 and 240 are formed through same deposition processes and are made of same materials.

Figure 6:
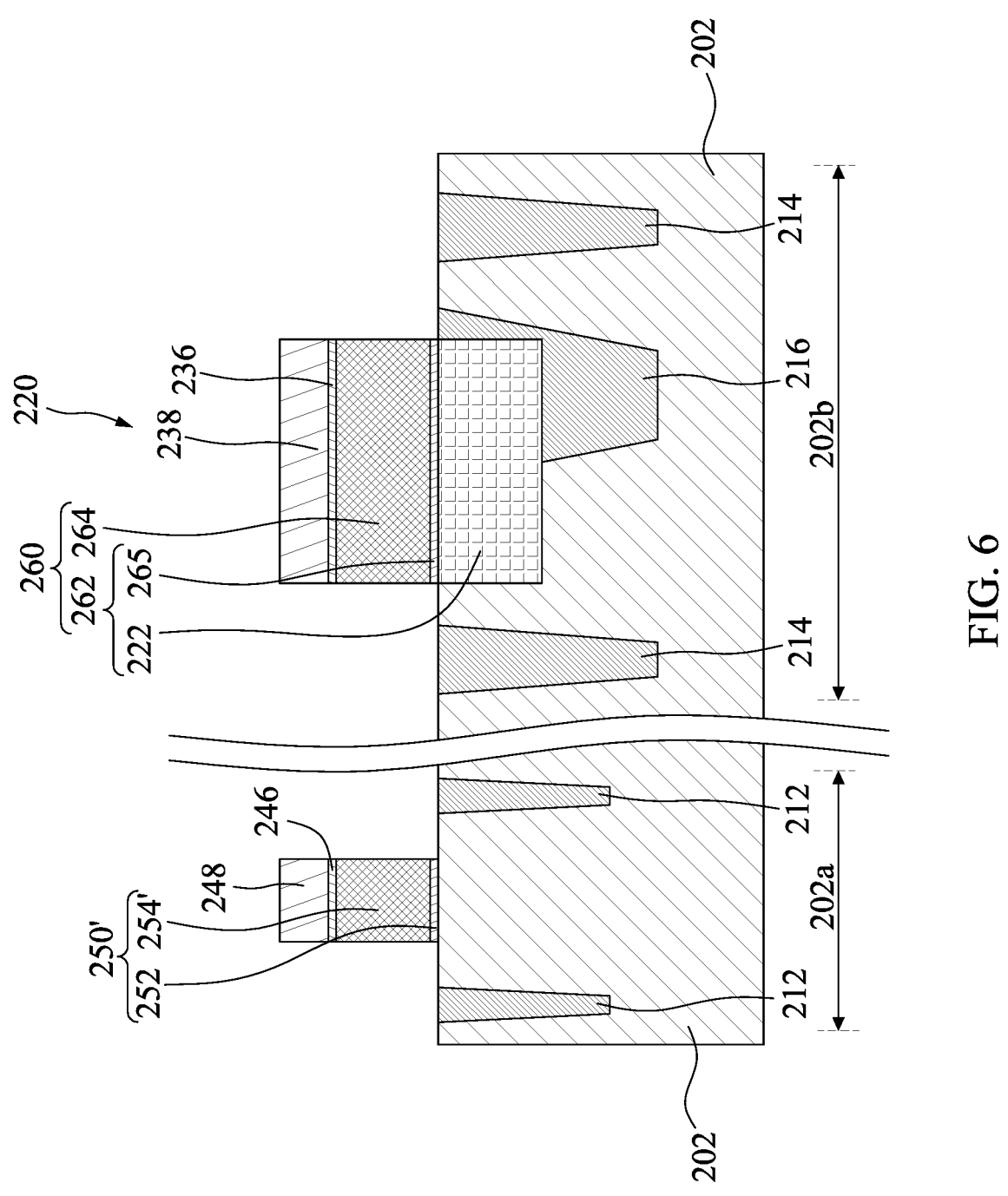

Referring to FIG. 6, in some embodiments, the precursor layer 240 in the first region 202a and the precursor layer 230 in the second region 202b are patterned. In some embodiments, a patterned layer (not shown) is formed over the precursor layer 240 in the first region 202a and the precursor layer 230 in the second region 202b. The patterned layer may be a patterned photoresist layer. In some embodiments, a photoresist layer is formed, and the photoresist layer is then patterned to form openings exposing portions of the precursor layer 240 in the first region 202a and portions of the precursor layer 230 in the second region 202b. In some embodiments, the hard mask layers 246 and 248 of the precursor layer 240 are patterned. The hard mask layers 236 and 238 of the precursor layer 230 may be concurrently patterned. After the patterning of the hard mask layers 236, 246, 238 and 248, the patterned layer is removed.

In some embodiments, the gate dielectric layer 242 and the gate electrode layer 244 of the precursor layer 240 are patterned to form a gate stack 250' including a gate dielectric layer 252 and a gate electrode 254'. The gate stack 250', the gate dielectric layer 252 and the gate electrode 254' may respectively be configured as a low-voltage gate stack 250', a low-voltage gate dielectric layer 252 and a low-voltage gate electrode 254'. In some embodiments, the gate electrode 254' includes polysilicon. The gate dielectric layer 252 may include a high-k gate dielectric layer.

In some embodiments, the gate dielectric layer 232 and the gate electrode layer 234 of the precursor layer 230 may be concurrently patterned to form one or more discrete portions 220 respectively overlying the gate dielectric layer 222. The portion 220 may include a gate dielectric layer 265 and a gate electrode 264. The portion 220 overlaps the gate dielectric layer 222. In some embodiments, the gate dielectric layer 265 may include a high-k gate dielectric layer, and the gate electrode 264 may be made of doped polysilicon. The gate dielectric layer 265 and the gate dielectric layer 222 may together be configured as a high-voltage gate dielectric layer 262. The gate electrode 264 may be configured as a high-voltage gate electrode 264. The gate electrode 264 overlaps the gate dielectric layer 222 and the gate dielectric layer 265. Accordingly, a gate (also referred to as a gate structure) 260 including the gate dielectric layer 262 and the gate electrode 264 is formed. The gate structure 260 may be configured as a high-voltage gate structure 260.

Figure 7:
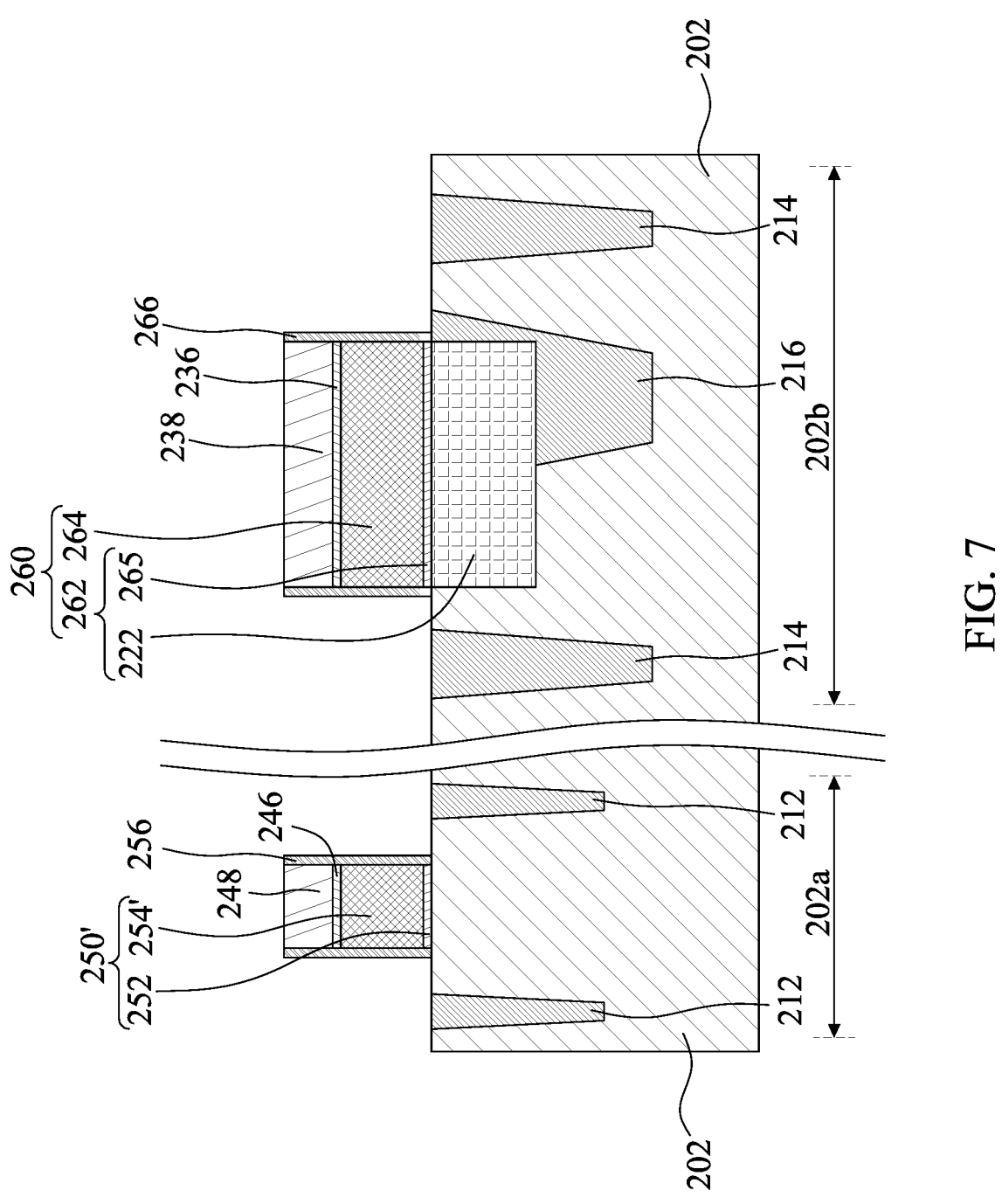

Referring to FIG. 7, in some embodiments, spacers 256 and 266 are formed on sidewalls of the gate stack 250' and the gate structure 260, respectively. In some embodiments, each of the spacers 256 and 266 includes a silicon nitride layer. In alternative embodiments, each of the spacers 256 and 266 includes a silicon oxide layer and a silicon nitride layer on the silicon oxide layer. The formation of the spacers 256 and 266 may include depositing blanket dielectric layers and then performing an anisotropic etching to remove horizontal portions of the blanket dielectric layers. Available deposition methods include plasma-enhanced chemical vapor deposition (PECVD), low-pressure chemical vapor deposition (LPCVD), sub-atmospheric chemical vapor deposition (SACVD), and other deposition methods.

Figure 8:
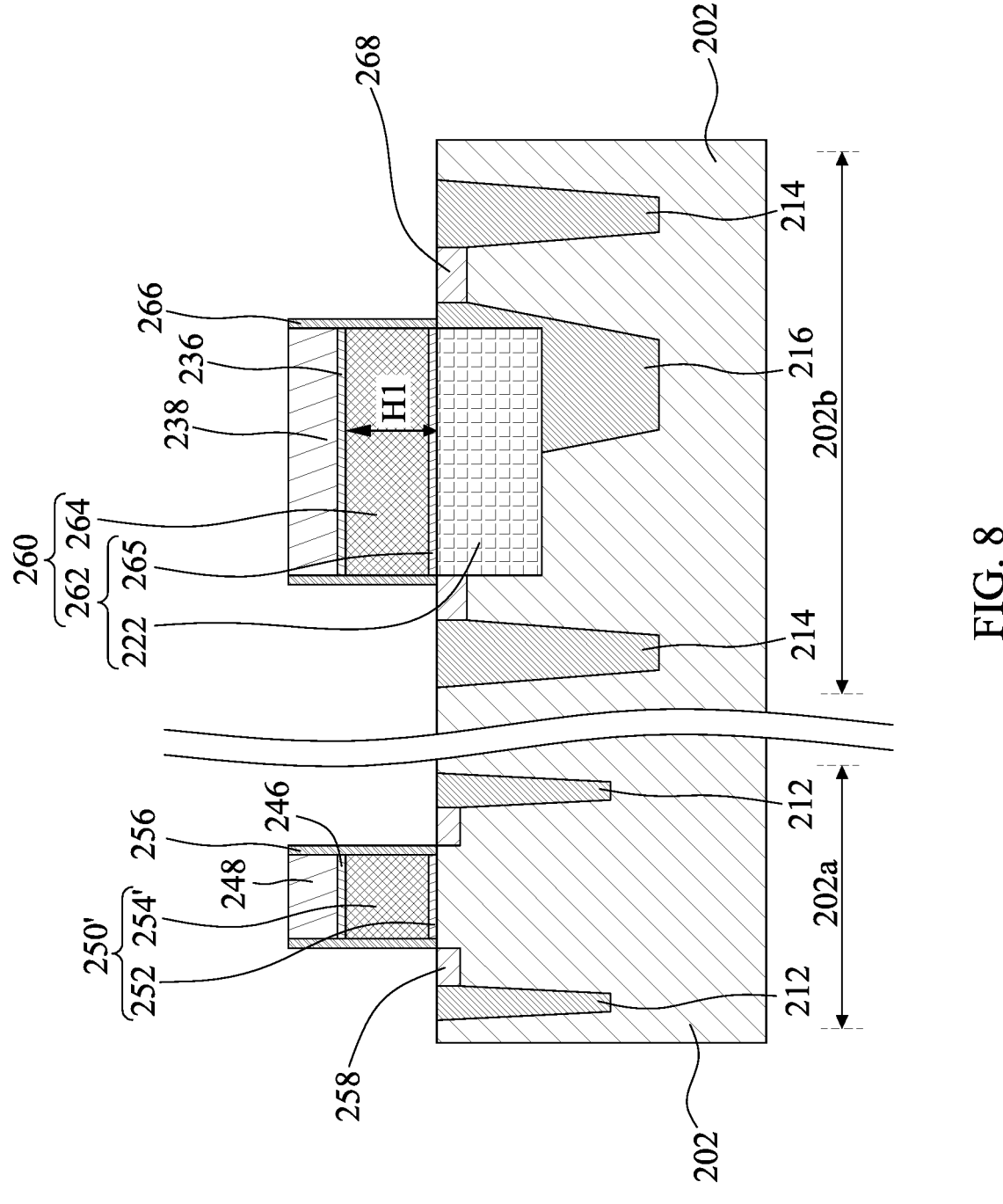

Referring to FIG. 8, in some embodiments, a pair of source/drain structures (or source/drain regions) 258 may be formed in the substrate 202 on opposite sides of the gate stack 250'. The source/drain structures 258 may be strained source/drain (S/D) structures. In some embodiments, the source/drain structures 258 are formed by growing a strained material by an epitaxial (epi) operation. In some embodiments, a lattice constant of the strained material may be different from a lattice constant of the substrate 202. In alternative embodiments, the source/drain structures 258 are formed by epitaxial growth followed by an implantation process. The implantation process may introduce suitable dopants into the source/drain structures 258. Configurations of the source/drain structures 258 depend on different epitaxial techniques, and are not limited herein. In some embodiments, the source/drain structures 258 include Ge, SiGe, InAs, InGaAs, InSb, GaSb, InAlP, InP, or a combination thereof.

In some embodiments, a pair of source/drain regions 268 may be formed in the substrate 202 on opposite sides of the gate structure 260. The source/drain regions 268 may extend along a first direction D1 on opposite sides of the gate dielectric layer 222. In some embodiments, the source/drain regions 268 may be formed in a single formation process. The source/drain regions 268 may be formed by a single implantation process. In some embodiments, the source/drain regions 268 are heavily doped. In some embodiments, a photoresist (not shown) is formed over the substrate 202 to define locations of the source/drain regions 268. The source/drain regions 268 may have edges aligned with edges of the spacers 266. The source/drain regions 268 may be asymmetrical with respect to the gate electrode 264. At this stage, the gate electrode 264 and the gate dielectric layer 265 may together have a height H1. In some embodiments, the height H1 is substantially in a range from about 580 angstroms (Å) to about 780 Å.

Alternatively or additionally, silicide layers (which are sometimes referred to as silicide regions) (not shown) may respectively be formed on exposed surfaces of the source/drain structures 258 and the source/drain regions 268, to reduce contact resistance. The formation process may include forming a resist protective oxide (RPO) over portions of the substrate 202 that are not protected by the spacers 256 and 266. The RPO may function as a silicide blocking layer during the formation of the silicide layers. The silicide layers may be formed using silicidation such as self-aligned silicide (salicide).

Figure 9:
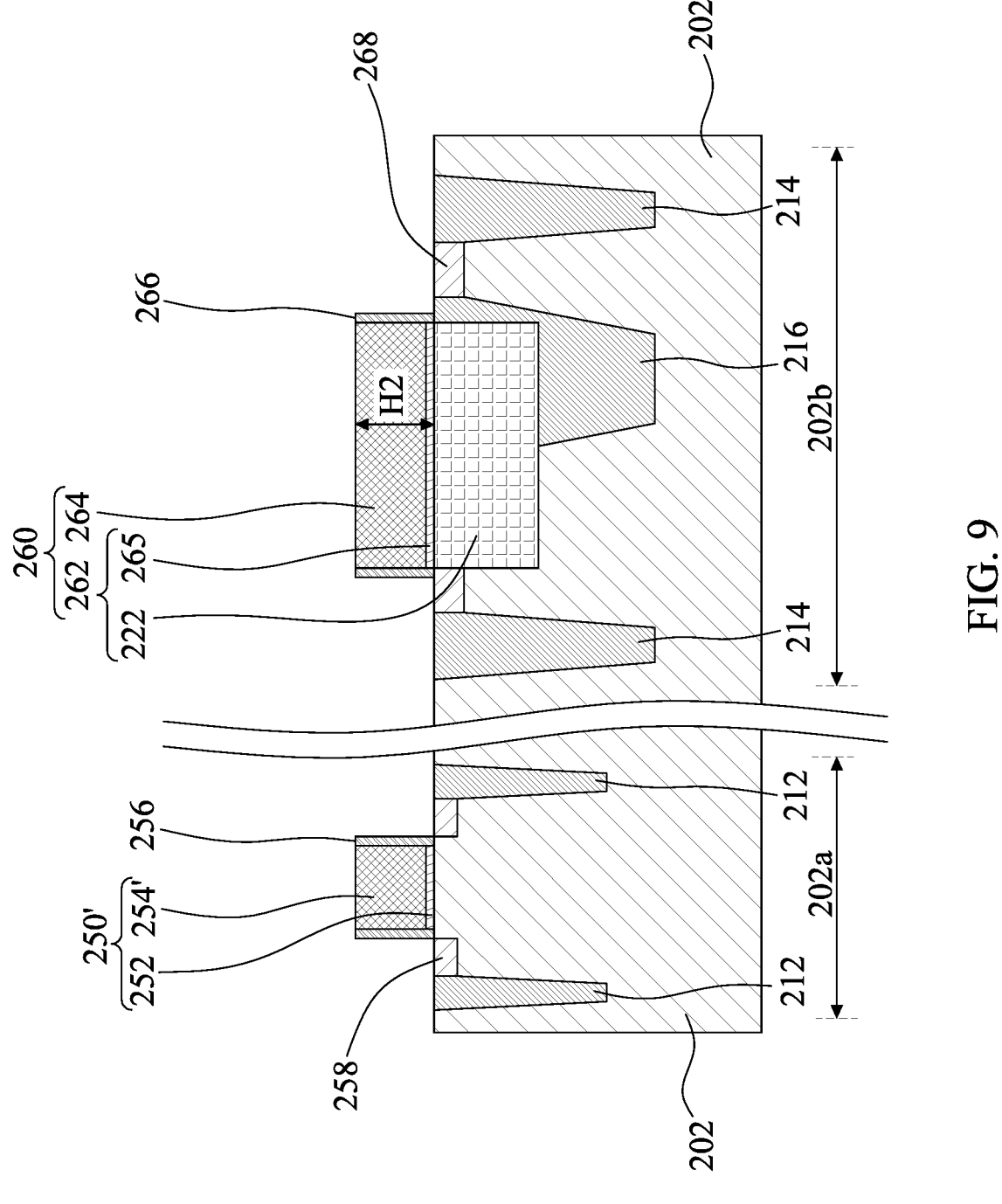

Referring to FIG. 9, in some embodiments, the hard mask layers 236, 238, 246 and 248 are removed. An etching process may be performed to remove the hard mask layers 236, 238, 246 and 248. In some embodiments, the etching process further removes portions of the spacers 256 and 266. In some embodiments, the gate electrode 254' in the first region 202a and the gate electrode 264 in the second region 202b are respectively configured as an etch stop layer during the etching process. In some embodiments, an upper surface of the gate electrode 264 is substantially aligned with (or substantially coplanar with) an upper surface of the gate electrode 254'. Due to the removal of the hard mask layers 236, 238, 246 and 248, the gate electrode 264 and the gate dielectric layer 265 may together have a reduced height H2. In some embodiments, the height H2 is substantially in a range from about 550 Å to about 750 Å.

Figure 10:
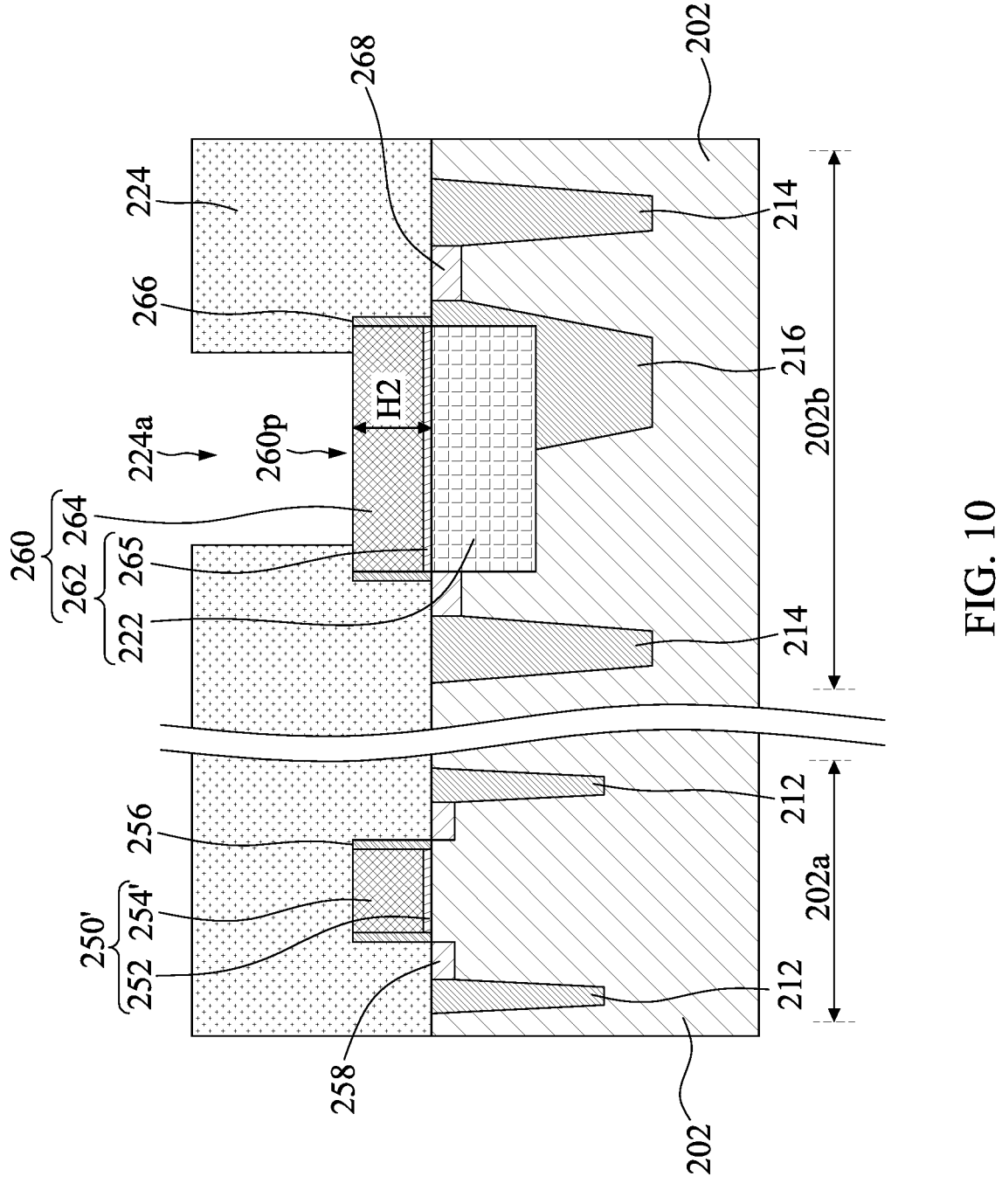

Referring to FIG. 10, in some embodiments, a patterned layer 224 is formed over the gate structure 260. The respective step is shown as operation 106 of the method 100 in FIG. 1. In some embodiments, one or more portions 260p of the gate structure 260 are exposed through the patterned layer 224. The patterned layer 224 may be a patterned photoresist layer. In some embodiments, a photoresist layer is formed, and the photoresist layer is then patterned to form the patterned layer 224 including openings 224a exposing the portions 260p of the gate structure 260 (or the gate electrode 264) in the second region 202b. In some embodiments, the gate stack 250' is entirely covered by the patterned layer 224.

Figure 11:
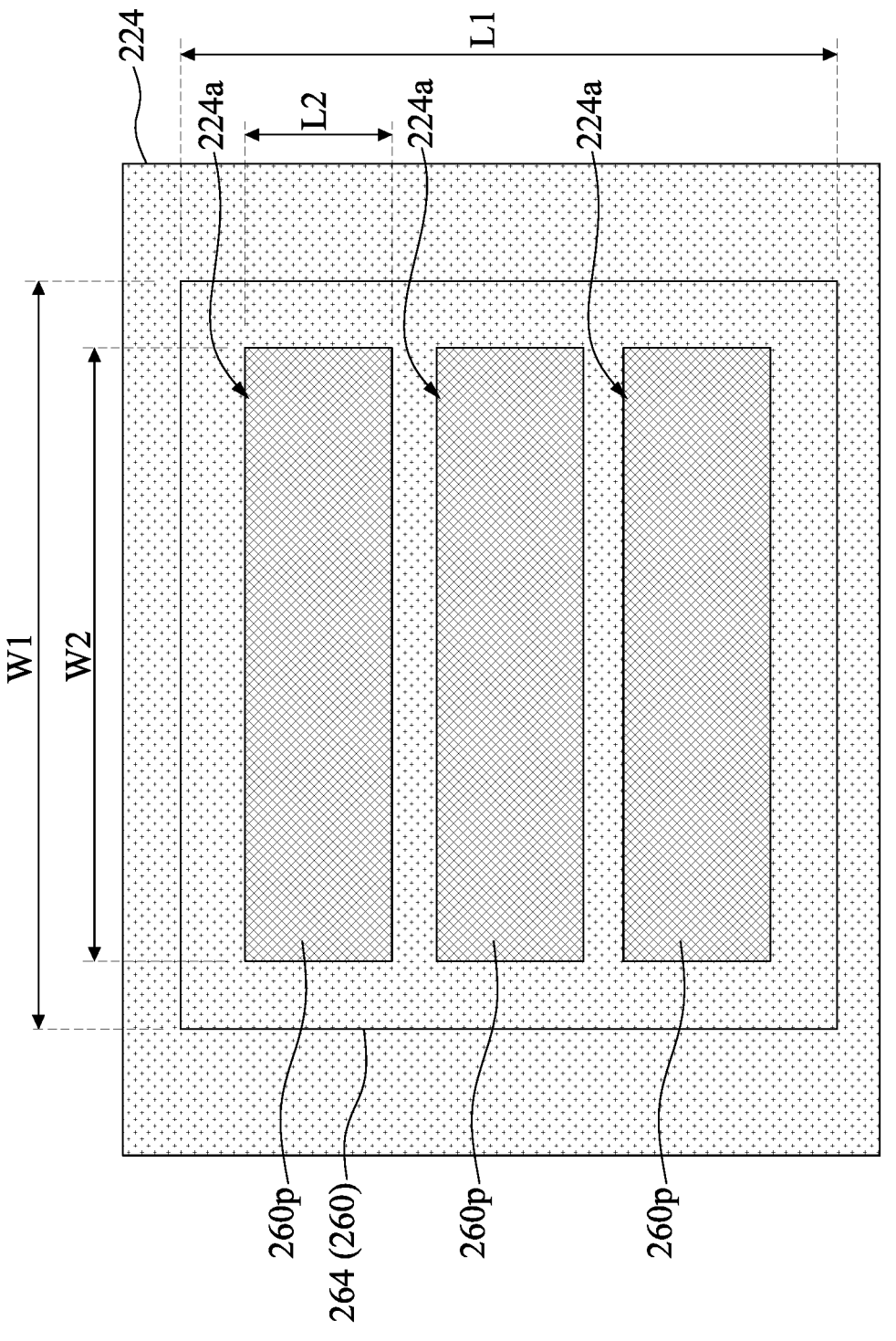
FIG. 11 is a top view illustrating a semiconductor structure at a fabrication stage according to aspects of one or more embodiments of the present disclosure.

FIG. 11 illustrates a top view of the gate structure 260 (or the gate electrode 264) and the patterned layer 224 in the second region 202b. The gate structure 260 (or the gate electrode 264) may have a width W1 and a length L1. In some embodiments, the width W1 and length L1 of the gate electrode 264 are selected such that the resulting gate structure 260 can meet the requirements for high-voltage application. In some embodiments, the width W1 is substantially equal to the length L1. In some embodiments, the width W1 and the length L1 are substantially in a range from about 10 micrometers (μm) to about 30 μm, respectively.

The portion 260p (or the opening 224a) may have a width W2 and a length L2. In some embodiments, the width W2 and the length L2 of the portion 260p (or the opening 224a) are selected such that the resulting gate structure 260 can meet the requirements for high-voltage application. Alternatively, the width W2 or the length L2 may respectively be selected to be substantially equal to a width or a length of the gate stack 250'. In some embodiments, the width W2 is substantially in a range from about 8 micrometers (μm) to about 28 μm. In some embodiments, the length L2 is substantially in a range from about 0.1 μm to about 1 μm. FIG. 11 is for illustration of relative positions of the gate structure 260 and the patterned layer 224 according to some embodiments from a top view perspective, but is not intended to limit the present disclosure.

Figure 12:
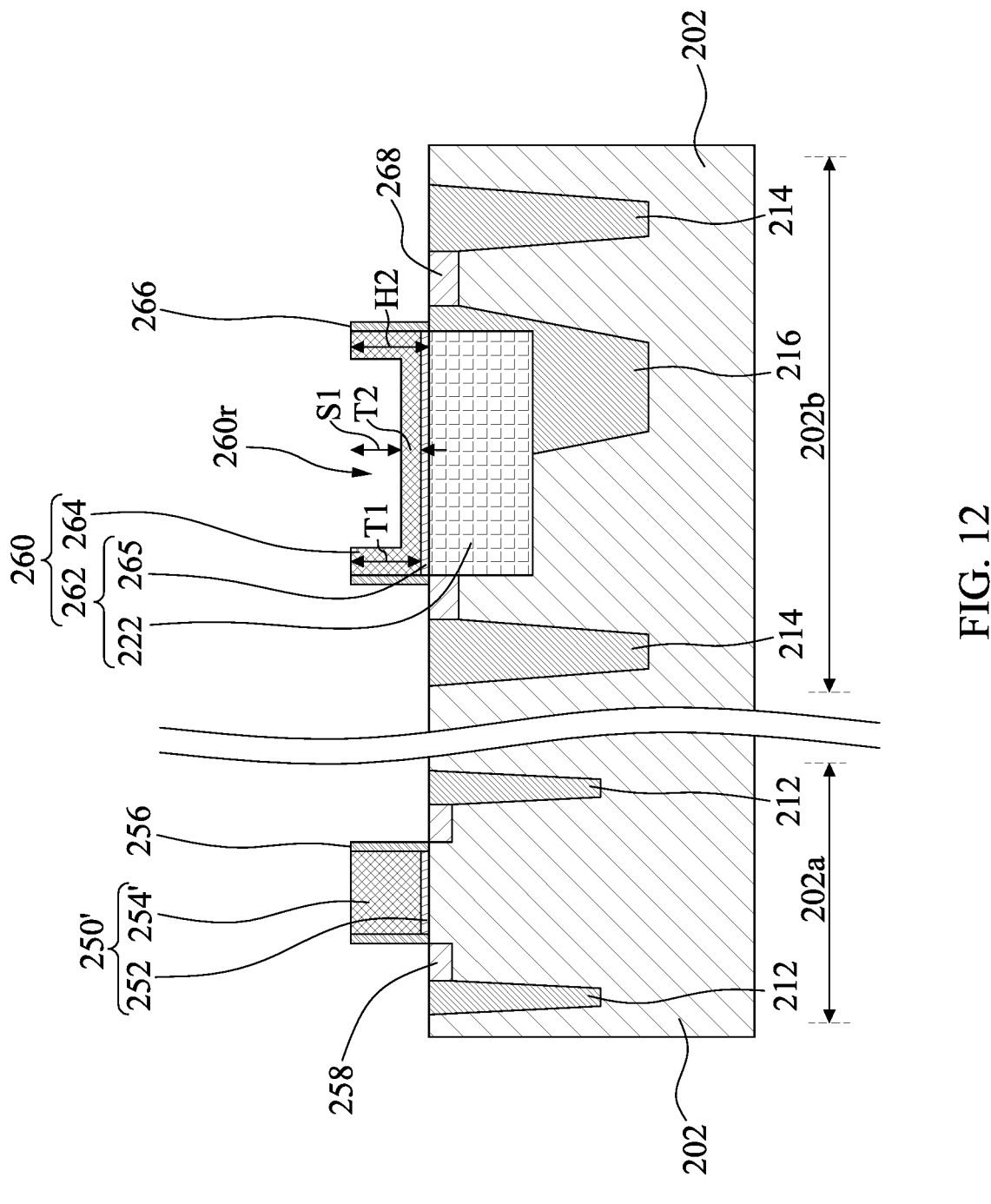

Referring to FIG. 12, in some embodiments, the portions 260p of the gate structure 260 (or gate electrode 264) are removed to form one or more recesses 260r in the gate structure 260 (or gate electrode 264). The respective step is shown as operation 108 of the method 100 in FIG. 1. The exposed portions 260p of the gate structure 260 (or gate electrode 264) may be removed by one or more etching processes. The etching processes may include a dry etch or a wet etch. Only the exposed portions 260p are removed in the etching processes, while other portions of the gate electrode 264 covered by patterned layer 224 remain intact after the removal of the exposed portions 260p. After the removal of the portions 260p, the patterned layer 224 is then removed.

Figure 13A:
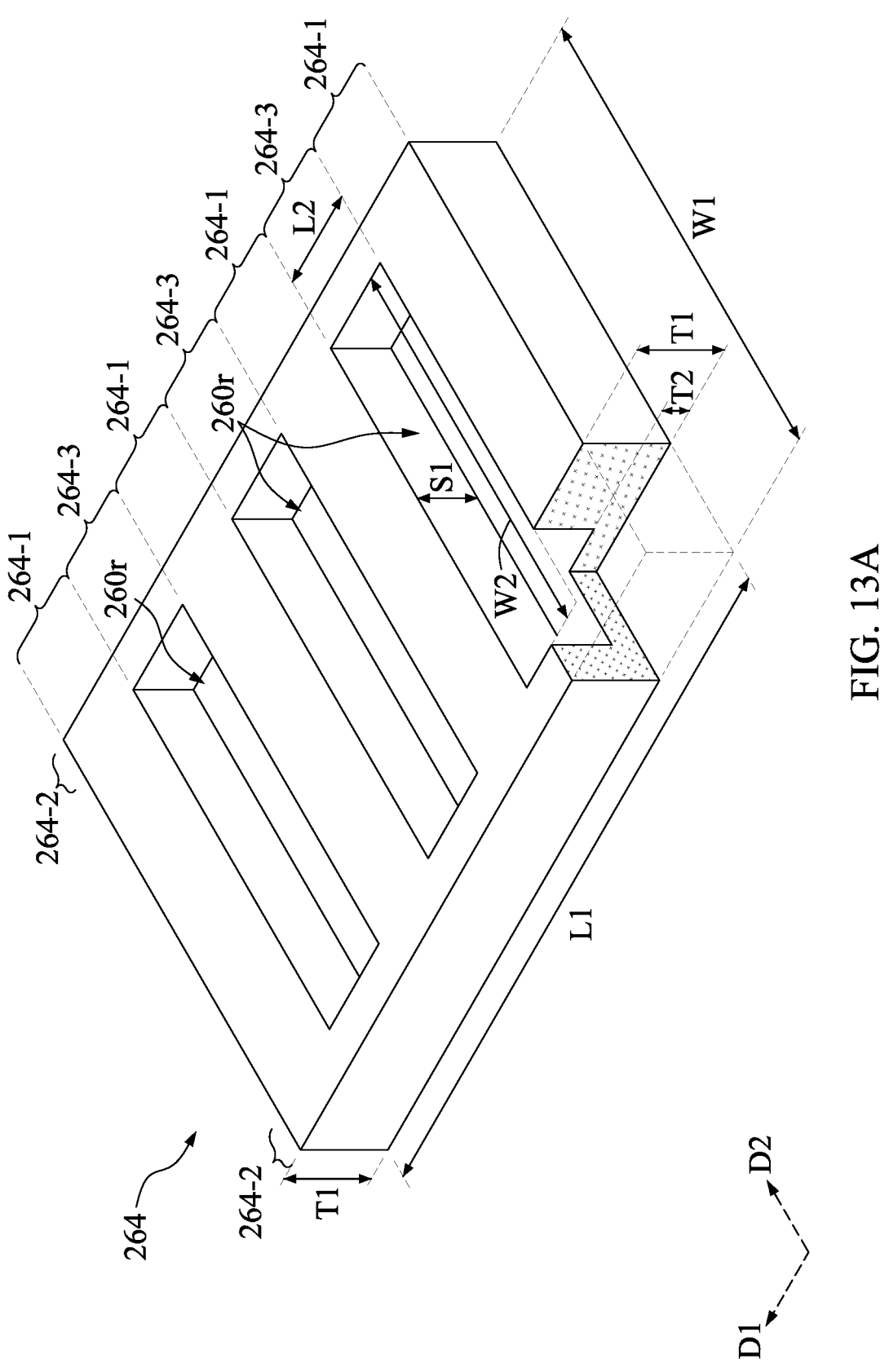
FIGS. 13A to 13C are schematic views illustrating a semiconductor structure according to aspects of one or more embodiments of the present disclosure.

FIG. 13A illustrates a perspective view of the gate electrode 264. In some embodiments, the recess 260r has the width W2 and the length L2. The recess 260r further has a depth S1. The depth S1 is selected such that the resulting gate electrode 264 can meet the requirements for high-voltage application. In some embodiments, the depth S1 is substantially in a range from about 350 Å to about 550 Å.

In some embodiments, the gate electrode 264 has one or more first segments 264-1 extending along a second direction D2. The first segments 264-1 may extend in parallel to each other. The gate electrode 264 further has one or more second segments 264-2 extending along the first direction D1. The second segments 264-2 may extend in parallel to each other. The first segments 264-1 may be physically or electrically connected to the second segments 264-2. Furthermore, the first segments 264-1 in different rows may be electrically connected to each other. For example, a first segment 264-1 in a first row is physically or electrically connected to a first segment 264-1 in a second row through the second segment 264-2. Also, the first segment 264-1 in the second row is physically or electrically connected to a first segment 264-1 in the third row through the second segment 264-2. In some embodiments, a dimension of each of the second segments 264-2 is different from a dimension of each of the first segments 264-1. In some embodiments, the dimension of each of the second segments 264-2 is substantially greater than or equal to the dimension of each of the first segments 264-1. In some embodiments, the first segments 264-1 and the second segments 264-2 may respectively have a thickness T1. The thickness T1 is selected such that the resulting gate electrode 264 can meet the requirements for high-voltage application. In some embodiments, the thickness T1 is substantially in a range from about 550 Å to about 750 Å.

Alternatively or additionally, the gate electrode 264 has one or more third segments 264-3 extending along the second direction D2. The third segments 264-3 may be exposed through the first segments 264-1 and the second segments 264-2. The third segments 264-3 may extend in parallel to each other. The third segments 264-3 may be physically or electrically connected to the first segments 264-1 and the second segments 264-2. Furthermore, the first segments 264-1 in different rows may be electrically connected to each other through the third segments 264-3. In some embodiments, the third segments 264-3 may have a thickness T2. The thickness T2 is selected such that the resulting gate electrode 264 can meet the requirements for high-voltage application. In some embodiments, the thickness T2 is less than the thickness T1. In some embodiments, the thickness T2 is substantially in a range from about 100 Å to about 300 Å.

The layout of the gate electrode 264 may be configured based on different requirements for different semiconductor devices. In some other embodiments, the first segments 264-1 may not be parallel to each other. For example, each of the first segments 264-1 has multiple sections forming a piece-linear segment 264-1, in which the sections may or may not be parallel to each other. In other embodiments, the first segments 264-1 may be in a serpentine or meandering shape extending along the second direction D2.

The structures of the present disclosure are not limited to the above-mentioned embodiments and may have other different embodiments. To simplify the description and for convenience of comparison between each of the embodiments of the present disclosure, identical (or like) components in each of the following embodiments are marked with identical (or like) numerals. For making it easier to compare differences between the embodiments, the following description will detail dissimilarities among different embodiments, while identical features, values and definitions will not be repeated.

Figure 13B:
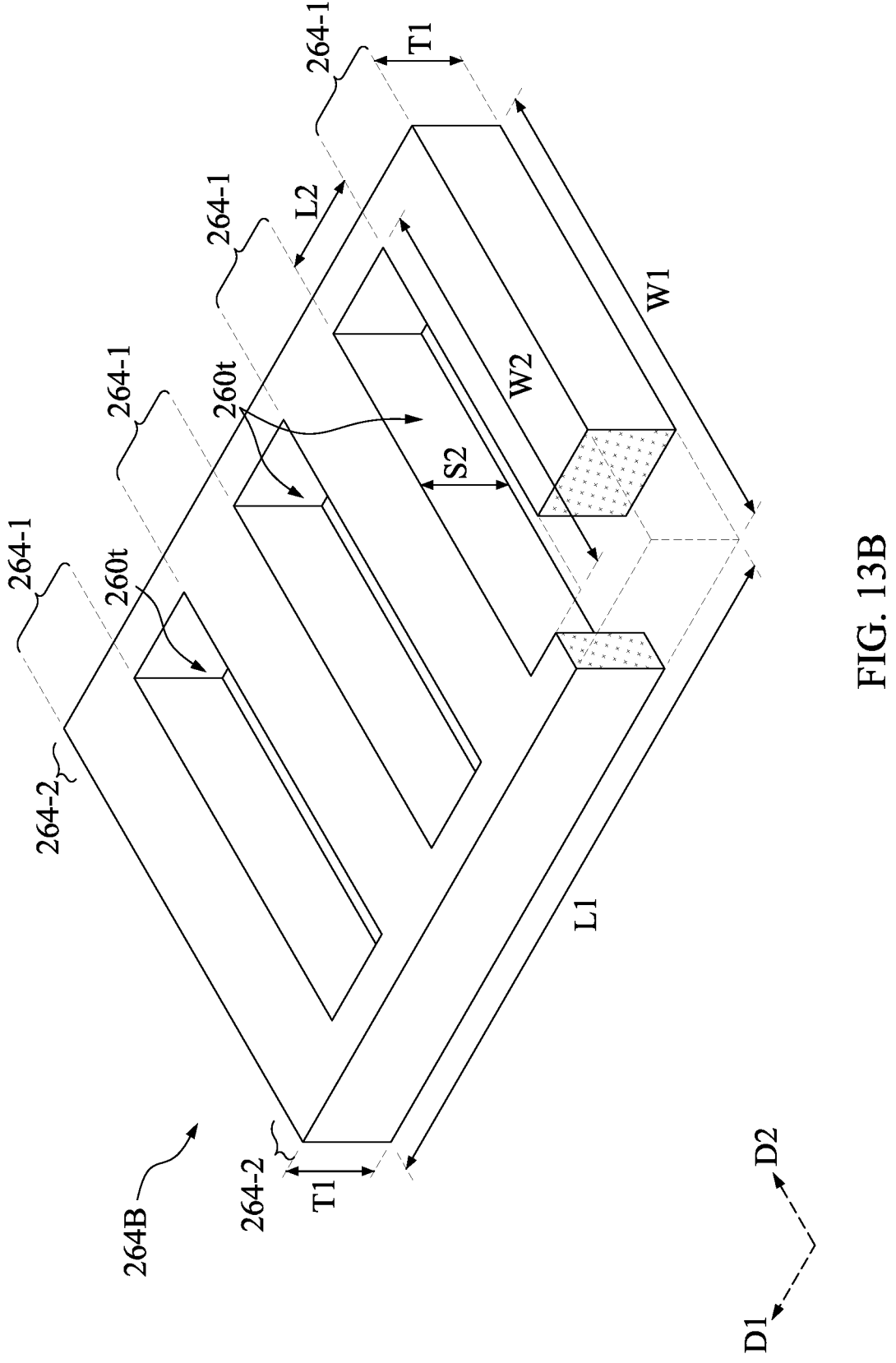

FIG. 13B illustrates a perspective view of an alternative gate electrode 264B. In some embodiments, exposed portions (e.g., portions 260p in FIGS. 10 and 11) of the gate electrode 264B are entirely removed to form one or more trenches 260t. The trenches 260t penetrate through the gate electrode 264B. In some embodiments, the trench 260t has the width W2 and the length L2. Furthermore, each of the trenches 260t may have a height S2 greater than the depth D1 (FIG. 13A).

In some embodiments, the gate electrode 264B has one or more first segments 264-1 extending along the second direction D2 and one or more second segments 264-2 extending along the first direction D1. In some embodiments, the first segments 264-1 and the second segments 264-2 may respectively have a thickness T1. The thickness T1 is selected such that the resulting gate electrode 264B can meet the requirements for high-voltage application. In some embodiments, the thickness T1 is substantially in a range from about 550 Å to about 750 Å. In some embodiments, the height S2 is substantially equal to the thickness T1.

Figure 13C:
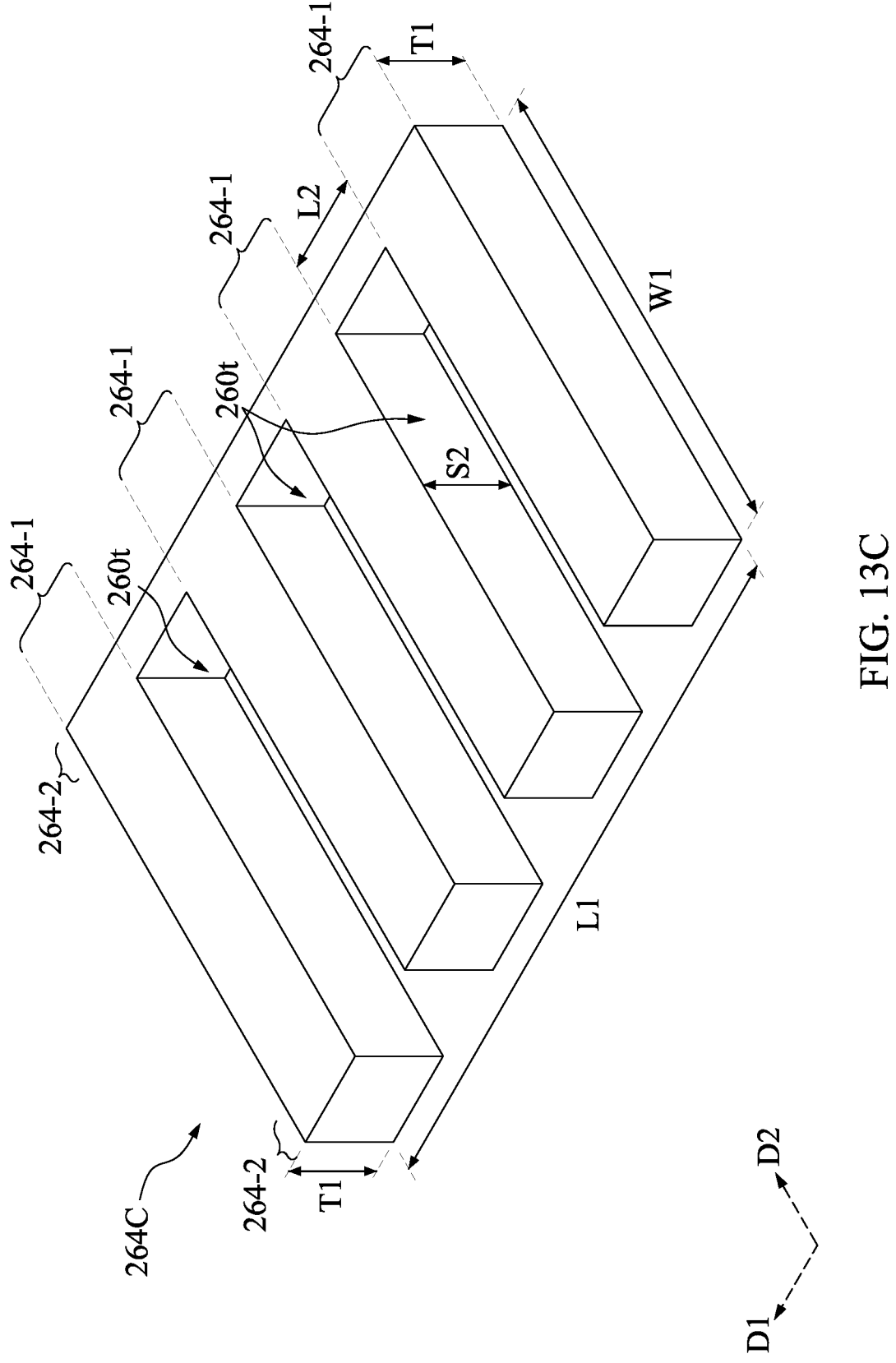

FIG. 13C illustrates a perspective view of an alternative gate electrode 264C. In some embodiments, the gate electrode 264C has one or more first segments 264-1 extending along the second direction D2 and only one second segment 264-2 extending along the first direction D1. Furthermore, the first segments 264-1 in different rows may be electrically connected to each other. For example, a first segment 264-1 in a first row is physically or electrically connected to a first segment 264-1 in a second row through the second segment 264-2. In some embodiments, the second segment 264-2 overlaps the isolation structure 216.

Figure 14:
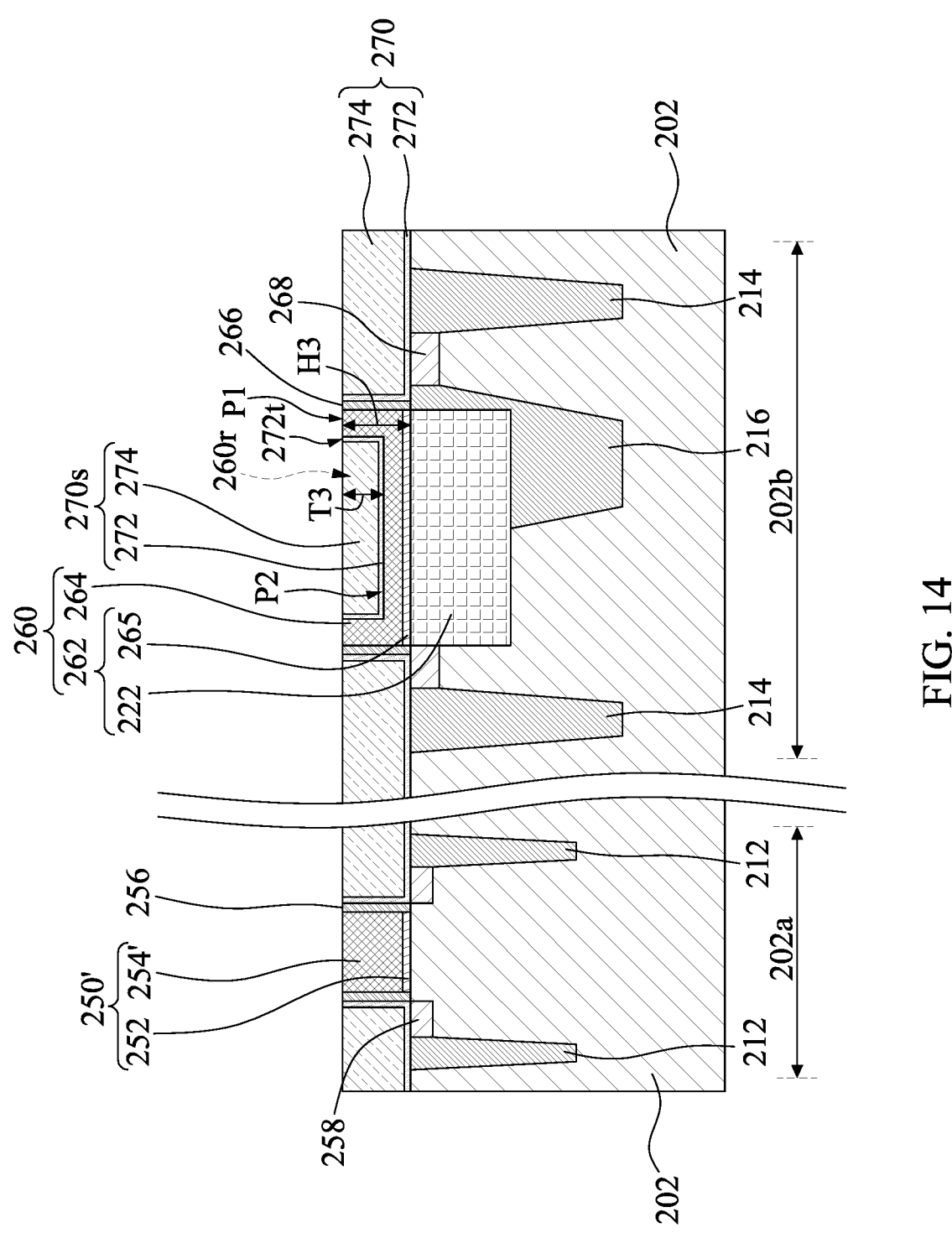

Referring to FIG. 14, subsequent to the operations described with reference to FIG. 13A, a dielectric layer 270 is formed over the gate stack 250' and fills the recess 260r of the gate structure 260. The respective step is shown as operation 110 of the method 100 in FIG. 1. In some embodiments, the dielectric layer 270 is formed surrounding the gate stack 250' and the gate structure 260. The dielectric layer 270 further fills the recess 260r.

In some embodiments, the dielectric layer 270 may include an etch-stop layer (e.g., a contact etch stop layer (CESL)) 272 and various dielectric layers (e.g., an interlayer dielectric (ILD) layer) 274 formed over the substrate 202. In some embodiments, the CESL 272 includes a SiN layer, a SiCN layer, a SiON layer, and/or other suitable materials. In some embodiments, the ILD layer 274 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials.

Still referring to FIG. 14, after the CESL 272 and the ILD layer 274 are deposited, a planarization process may be performed to planarize the dielectric layer 270 and form one or more dielectric structures 270s within the gate structure 260. The respective step is shown as operation 112 of the method 100 in FIG. 1. In some embodiments, after the planarization process, the gate electrode 264 and the gate dielectric layer 265 may together have a reduced height H3. In some embodiments, the height H3 is substantially in a range from about 470 Å to about 670 Å. In some embodiments, an upper surface of the dielectric layer 270 (or the dielectric structure 270s) is aligned with the upper surfaces of the gate electrodes 254' and 264. Additionally, an upper surface of the CESL layer 272 is aligned with the upper surfaces of the gate electrodes 254' and 264. In some embodiments, the dielectric structures 270s overlap the gate dielectric layer 262 (including the gate dielectric layer 222 and the gate dielectric layer 265). In some embodiments, each of the dielectric structures 270s includes the CESL layer 272 and the ILD layer 274 over the CESL layer 272. In some embodiments, the gate electrode 264 includes a first planar surface P1 aligned with a top surface 272t of the CESL layer 272 and a second planar surface P2 lower than the top surface 272t of the CESL layer 272.

Figure 15:
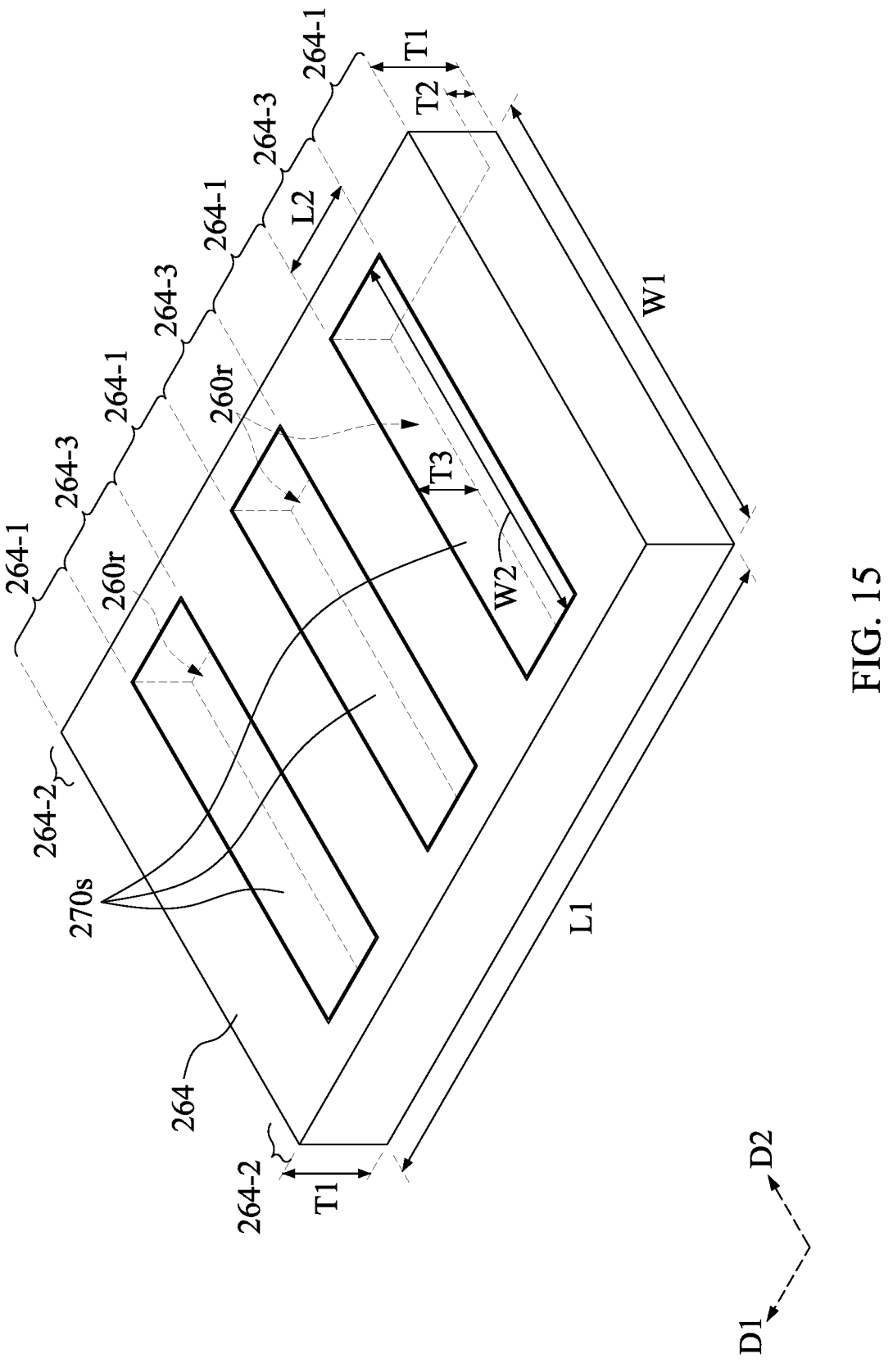
FIG. 15 is a schematic view illustrating a semiconductor structure according to aspects of one or more embodiments of the present disclosure.

FIG. 15 illustrates a perspective view of the gate electrode 264 and the dielectric structures 270s. In some embodiments, each of the dielectric structures 270s has the width W2 and the length L2. The dielectric structure 270s further has a thickness T3 less than or substantially equal to the depth S1. In some embodiments, the thickness T3 is substantially in a range from about 370 Å to about 530 Å. In some embodiments, the dielectric structures 270s extend along the second direction D2. The dielectric structures 270s may extend in parallel to each other. In some embodiments, the dielectric structures 270s and the first segments 264-1 are arranged in an alternating pattern. In some embodiments, a dimension of each of the first segments 264-1 is substantially equal to a dimension of each of the dielectric structures 270s. In some embodiments, the first segments 264-1 are separated from one another by the dielectric structures 270s. In some embodiments, the dielectric structures 270s are separated from the gate dielectric layer 262 by the gate electrode 264. In some alternative embodiments where the dielectric structures 270s are formed subsequent to the operations described with reference to FIG. 13B or FIG. 13C, the dielectric structures 270s directly contact the gate dielectric layer 262.

Figure 16:
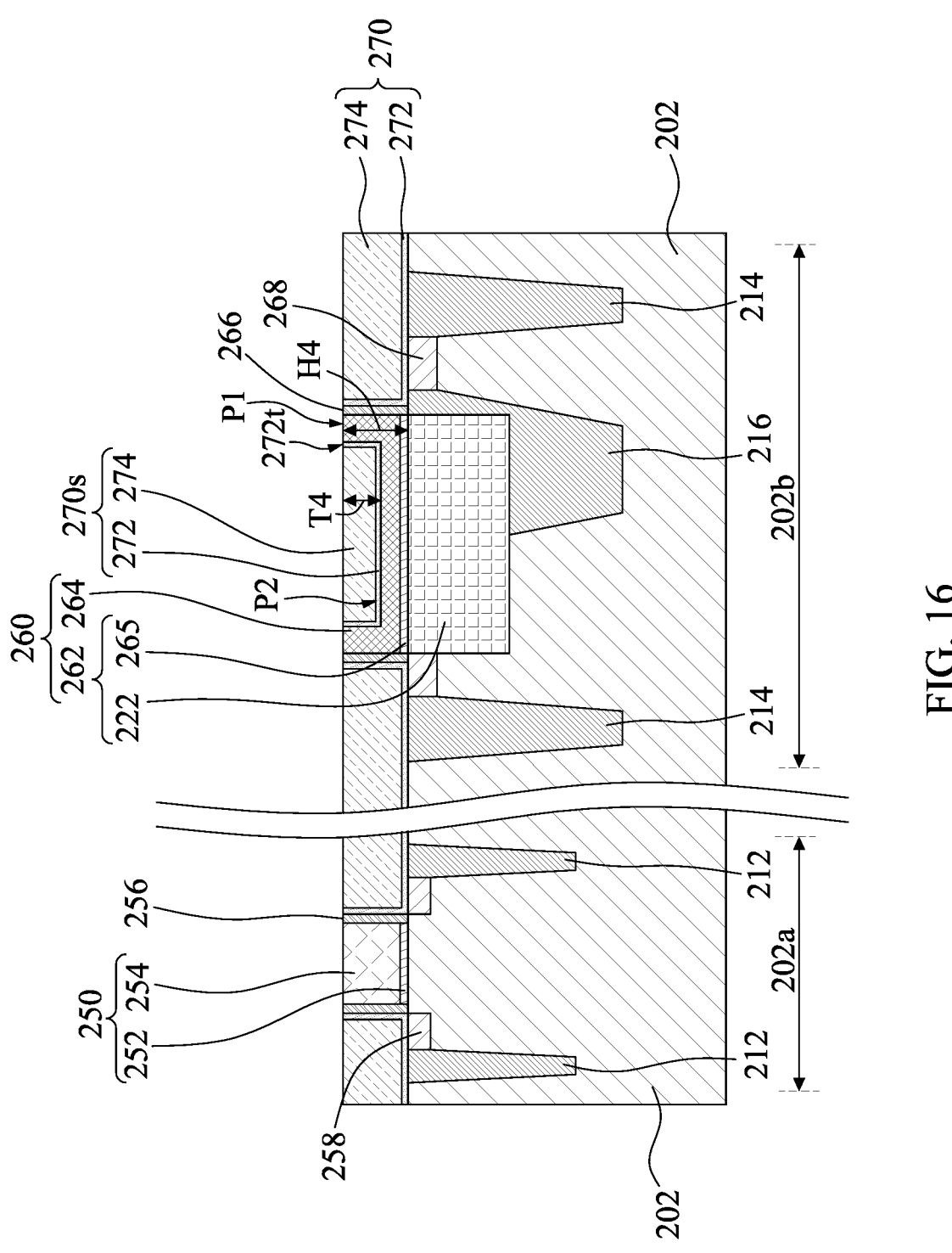

Referring to FIG. 16, in some embodiments, a replacement gate process may be subsequently performed by replacing the gate electrode 254' with metal materials to form a gate electrode 254. A gate structure 250 including the gate electrode 254 and the gate dielectric layer 252 is thus formed. A series of deposition and etching processes may be performed to form different metal compositions for different devices or different components of the same devices, in order to achieve desired work functions. In some embodiments, the gate electrode 254 may be made of metal or a metal alloy. In some embodiments, the gate electrode 254 may include a core metal layer such as copper (Cu), tungsten (W), aluminum (Al), or an alloy thereof, and a barrier layer such as titanium (Ti), tantalum (Ta), zirconium (Zr), or an alloy thereof. The gate electrode 254 may be configured as a low-voltage gate electrode 254. In some alternative embodiments, another gate dielectric layer may be formed to cover bottom and sidewall surfaces of the gate electrode 254. In such embodiments, the gate dielectric layer includes a high-k dielectric material with a dielectric constant greater than 3.9. Examples of a material of the gate dielectric layer include hafnium oxide (HfO), hafnium silicon oxide (HfSiO), hafnium aluminum oxide (HfAlO), and hafnium tantalum oxide (HfTaO).

In some embodiments, a planarization process may be performed to planarize the gate electrode 254. In some embodiments, after the planarization process, the gate electrode 264 and the gate dielectric layer 265 may together have a reduced height H4. In some embodiments, the height H4 is substantially in a range from about 250 Å to about 450 Å. Alternatively or additionally, the dielectric structure 270s may have a reduced thickness T4. In some embodiments, the thickness T4 is substantially in a range from about 50 Å to about 150 Å. In some embodiments, an upper surface of the dielectric layer 270 (or the dielectric structure 270s) is aligned with the upper surfaces of the gate electrodes 254 and 264. Additionally, an upper surface of the CESL layer 272 is aligned with the upper surfaces of the gate electrodes 254 and 264. In some embodiments, an upper surface of the second segment 264-2 of the gate electrode 264 is aligned with the upper surface of the gate electrode 254. In some embodiments, the first planar surface P1 of the gate electrode 264 is aligned with a top surface of the gate electrode 254, and the second planar surface P2 of the gate electrode 264 is lower than the top surface of the gate electrode 254.

The proposed structure provides advantages. In some embodiments where the dielectric structure 270s is absent, a dishing effect may be introduced by planarization processes. Hence, the high-voltage gate electrode may have uneven surfaces, which could lead to device performance degradation in the high-voltage region. By forming the dielectric structure 270s within the gate electrode 264 as introduced above, the dielectric structure 270s may provide structural support during fabrication processes, such that the dishing effect is reduced or eliminated. Performance of the device may thereby be improved.

Figure 17:
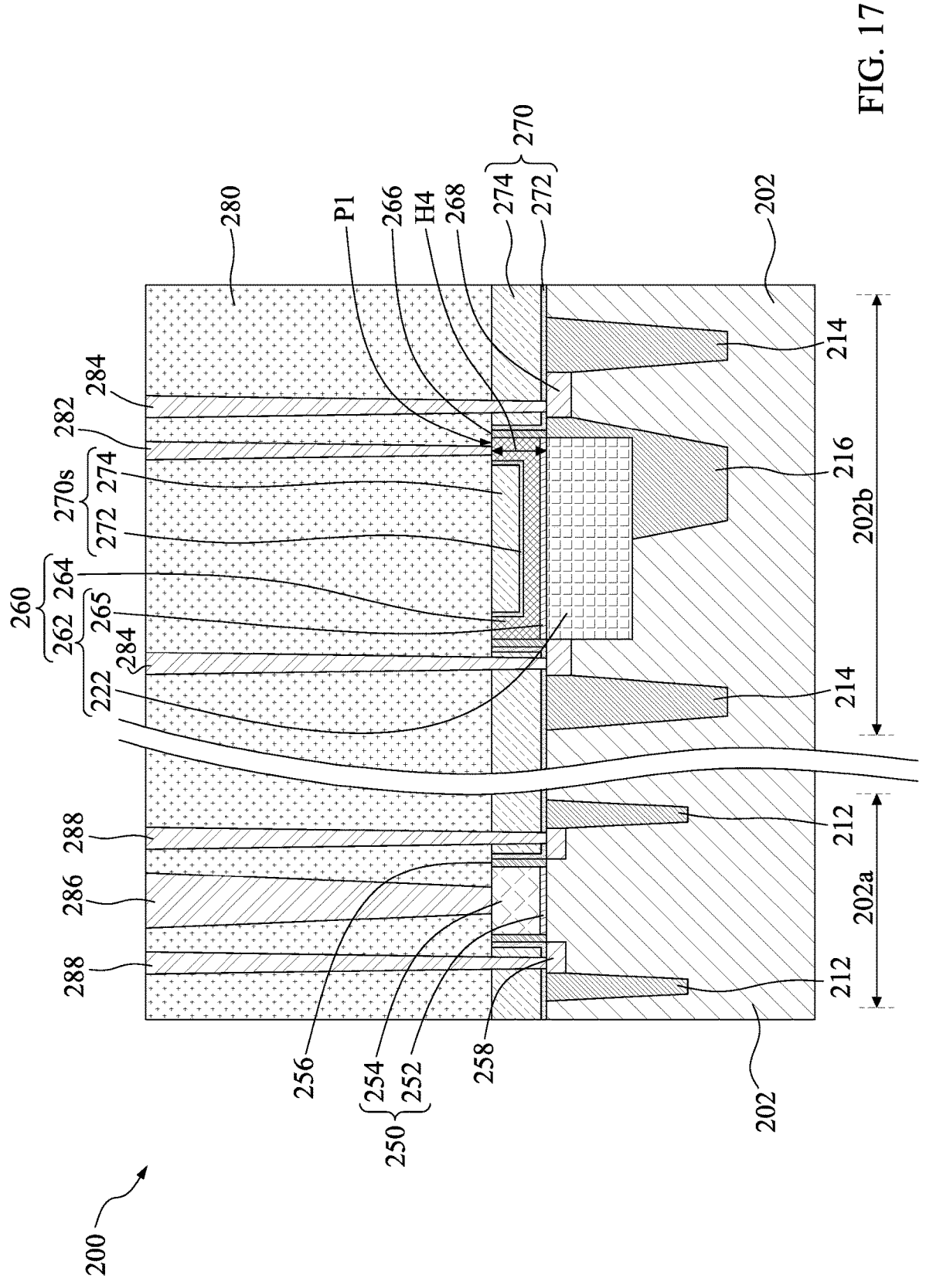

Referring to FIG. 17, in some embodiments, a dielectric layer 280 is formed over the dielectric layer 270. The ILD layer 274 and the dielectric layer 280 may include same or different low-k dielectric layers, ultra-low-k dielectric layers, extreme low-k dielectric layers, and/or silicon dioxide layers.

In some embodiments, contact structures (also referred to as via structures) 282, 284, 286 and 288 are formed through the dielectric layer 280. The contact structures 282 and 286 may respectively reach upper surfaces of the gate electrode 264 and the gate electrode 254. In some embodiments, the contact structure 282 is disposed over the first planar surface P1 of the gate electrode 264. The contact structure 282 may contact the second segment 264-2 of the gate electrode 264. Alternatively or additionally, the contact structures 284 and 288 may extend through the dielectric layers 270 and 280 and may be coupled to the source/drain regions 268 and the source/drain structures 258, respectively. The contact structures 282, 284, 286 and 288 may be formed by selectively etching the dielectric layer 280 and/or the dielectric layer 270 to form openings (e.g., with a patterned photoresist mask in place), and by subsequently depositing a conductive material within the openings. In some embodiments, the conductive material may include tungsten (W), copper (Cu), aluminum (Al) or titanium nitride (TiN), for example.

Different transistor devices in different regions are thus formed. A transistor device (or the gate structure) 250 including the gate dielectric layer 252 and the gate electrode 254 is disposed in the first region 202a. A transistor device (or the gate structure) 260 including the gate dielectric layer 262 and the gate electrode 264 is disposed in the second region 202b. The gate electrode 254 is a metal gate electrode and the gate electrode 264 is a polysilicon gate electrode. The transistor device 260 is configured to operate at an operation voltage greater than that of the transistor device

250. The gate electrode 264 may have a gate length and a gate width greater than those of the gate electrode 254. The gate dielectric layer 262 may have a thickness greater than that of the gate dielectric layer 252. In some embodiments, the thickness of the gate dielectric layer 222 is about 2 to 5 times a thickness of the gate dielectric layer 252, such that the gate dielectric layer 222 may support a greater breakdown voltage. The transistor device 260 may have a relatively high operating voltage level (e.g., greater than 10V). The transistor device 250 may be a core device or an I/O (input and output) device with a relatively low operating voltage level (e.g., less than 1.5V or around 1.5V to 3V).

Figure 18:
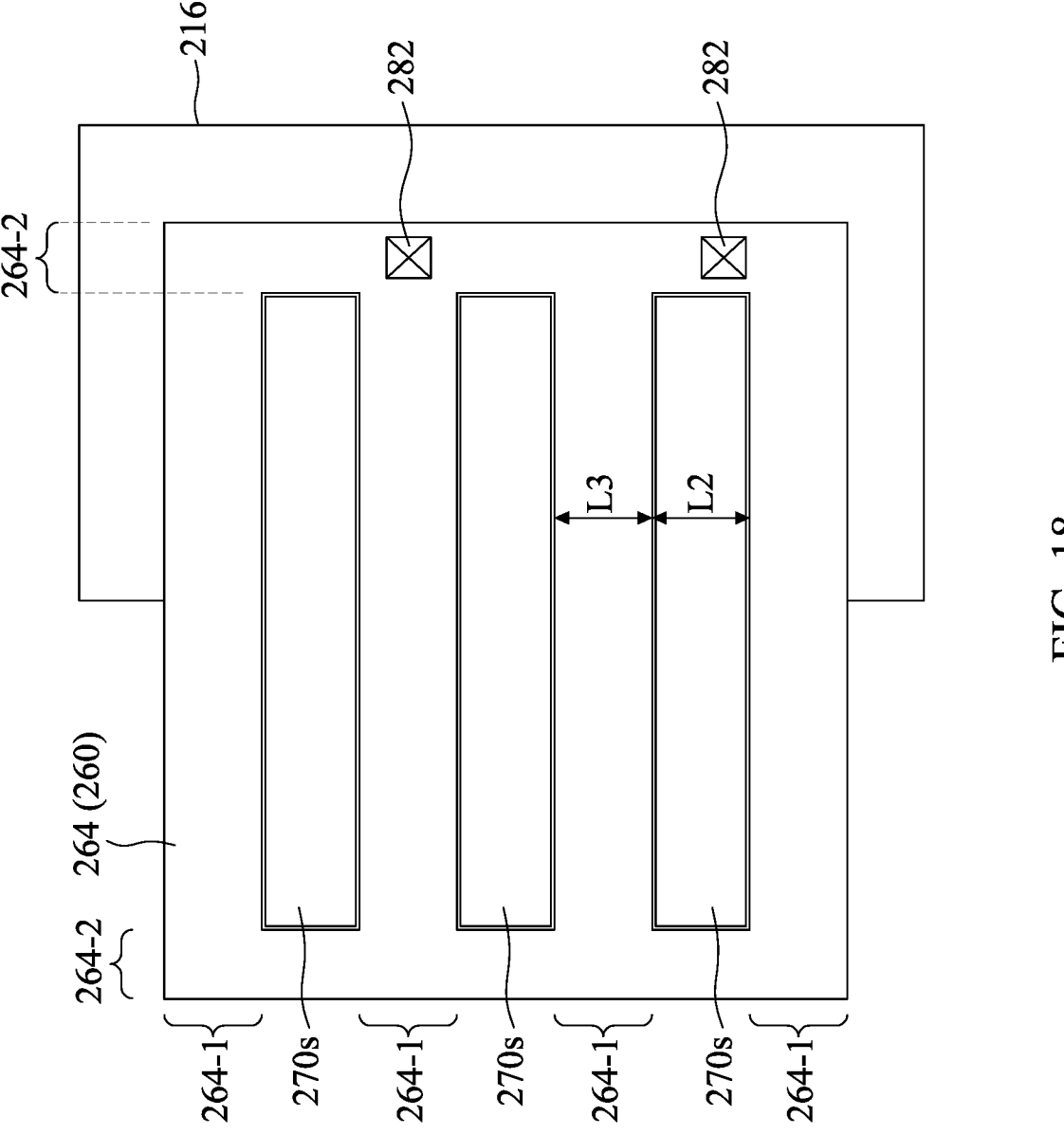
FIG. 18 is a top view illustrating a semiconductor structure according to aspects of one or more embodiments of the present disclosure.

FIG. 18 illustrates a top view of the gate structure 260 (or the gate electrode 264), the dielectric structures 270s, the contact structures 282 and the isolation structure 216 in the second region 202b. In some embodiments, at least one of the second segments 264-2 overlaps the isolation structure 216. The contact structures 282 may be disposed on the upper surface of the second segment 264-2 that overlaps the isolation structure 216. In some embodiments, the contact structure 282 may be aligned with the first segment 264-1. Alternatively, the contact structure 282 may be aligned with the dielectric structure 270s. In some embodiments, a dimension of a bottom of the contact structure 282 is less than the length L2 of the dielectric structure 270s or a length L3 of the first segment 264-1. The dimension of the bottom of the contact structure 282 is selected such that the resulting transistor device 260 can meet the requirements for high-voltage application. For example, the dimension of the bottom of the contact structure 282 is substantially in a range from about 25 nanometers (nm) to about 45 nm.

In some embodiments, a total area of the gate electrode 264 is defined as X, and a total area of the dielectric structures 270s is defined as Y. A ratio Y/X may be between about 21% and about 68% in accordance with some embodiments. The ratio Y/X may be also referred to as a pattern density of the gate electrode 264. In other words, the pattern density of the gate electrode 264 may be between about 21% and about 68%. The pattern density of the gate electrode 264 may be configured based on different requirements for different semiconductor devices.

The present disclosure provides embodiments of a semiconductor structure and forming method thereof that provide one or more improvements over existing approaches. By forming the dielectric structure within the gate structure as introduced above, the dielectric structure provides structural support during fabrication processes, such that a dishing effect is reduced or eliminated. Device performance may thereby be improved.

In accordance with some embodiments of the present disclosure, a semiconductor structure is provided. The semiconductor structure includes a substrate, a gate dielectric, a pair of source/drain regions, a gate electrode and a plurality of dielectric structures. The gate dielectric has a top surface aligned with a top surface of the substrate. The source/drain regions extend along a first direction on opposite sides of the gate dielectric. The gate electrode is disposed over the substrate and overlaps the gate dielectric. The gate electrode has a plurality of first segments extending in parallel along a second direction different from the first direction. The dielectric structures are disposed over the substrate, overlap the gate dielectric and extend in parallel along the second direction. The dielectric structures and the first segments are arranged in an alternating pattern.

In accordance with some embodiments of the present disclosure, a semiconductor structure is provided. The semiconductor structure includes a substrate, a first gate structure, a second gate structure and a dielectric structure. The substrate includes a first region and a second region. The first gate structure is disposed in the first region. The first gate structure includes a first gate dielectric and a first gate electrode disposed over the substrate. The second gate structure is disposed in the second region. The second gate structure includes a second gate dielectric having a top surface aligned with a top surface of the substrate and a second gate electrode disposed over the substrate. The second gate electrode includes a plurality of first segments extending in parallel along a first direction. The dielectric structure is disposed in the second region. The first segments are separated from one another by the dielectric structure.

In accordance with some embodiments of the present disclosure, a method of forming a semiconductor structure is provided. The method includes the following operations. A substrate having a first region and a second region is provided. A first gate is formed in the first region, and a second gate is formed in the second region. A patterned layer is formed over the second gate. A portion of the second gate is exposed through the patterned layer. The portion of the second gate is removed to form a recess in the second gate. A dielectric layer is formed over the first gate and fills the recess of the second gate. The dielectric layer is planarized to expose a top surface of the first gate and form a dielectric structure within the second gate.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   providing a substrate having a first region and a second region;
   forming a trench in the substrate in the second region;
   forming a first gate in the first region and a second gate in the second region, wherein the second gate comprises a gate dielectric layer and a gate electrode over the gate dielectric layer, the gate dielectric layer is disposed in the trench, and a bottom surface of the gate dielectric layer is lower than a top surface of the substrate;
   forming a patterned layer over the second gate, wherein the patterned layer comprises at least an opening, a portion of the gate electrode of the second gate is exposed through the opening of the patterned layer, and a width of the opening is less than a width of the gate electrode of the second gate;
   removing the portion of the gate electrode of the second gate to form a recess in the second gate;
   forming a dielectric layer over the first gate and filling the recess of the second gate; and
   planarizing the dielectric layer to expose a top surface of the first gate and form a dielectric structure within the second gate.

2. The method of claim 1, wherein the gate electrode of the second gate includes a first planar surface aligned with the top surface of the first gate and a second planar surface lower than the top surface of the first gate.

3. The method of claim 1, wherein a top surface of the dielectric structure is aligned with the top surface of the first gate.

4. The method of claim 1, further comprising replacing the first gate with a metal gate structure.

5. A method for forming a semiconductor structure, comprising:
   Receiving a substrate comprising at least an isolation structure disposed therein;
   Forming a trench in the substrate and the isolation structure;
   Filling the trench with a first dielectric layer;
   Forming a gate structure over the first dielectric layer, wherein sidewalls of the gate structure are free of the first dielectric layer;
   Forming a patterned layer over the gate structure, wherein a portion of the gate structure is exposed through the patterned layer;
   Removing the portion of the gate structure to form a recess in the gate structure;
   Filling the recess with a first dielectric structure, and
   Planarizing the first dielectric structure, wherein a top surface of the first dielectric structure is at a same height as a top surface of the gate structure.

6. The method of claim 5, wherein a portion of the substrate and a portion of the isolation structure are exposed through a bottom of the trench.

7. The method of claim 5, wherein a top surface of the isolation structure, a top surface of the first dielectric layer and a top surface of the substrate are aligned with each other.

8. The method of claim 5, wherein the forming of the gate structure further comprises:
   forming a second dielectric layer and a gate electrode layer over the substrate; and
   patterning the second dielectric layer and the gate electrode layer to form the gate structure.

9. The method of claim 8, wherein the gate electrode layer is exposed through sidewalls and a bottom of the recess.

10. The method of claim 5, further comprising forming a spacer on sidewalls of the gate structure.

11. The method of claim 5, wherein the forming of the first dielectric structure further comprises:
   forming a contact etch stop layer (CESL) and an interlayer dielectric (ILD) over the substrate and fill the recess; and
   planarizing the CESL and the ILD to expose a top surface of the gate structure and to form the first dielectric structure.

12. The method of claim 5, further comprising forming a second dielectric structure laterally surrounding the gate structure simultaneously with the forming of the first dielectric structure.

13. The method of claim 12, wherein a top surface of the first dielectric structure, a top surface of the second dielectric structure and a topmost surface of the gate structure are aligned with each other.

14. The method of claim 5, further comprising forming a contact structure coupled to the gate structure.

15. A method for forming a semiconductor structure, comprising:
   Receiving a substrate comprising at least an isolation structure disposed therein;
   forming a trench in the substrate and the isolation structure;

forming a sacrificial gate and a gate structure separated from each other over the substrate, wherein the gate structure comprises a first dielectric layer and a second dielectric layer over the first dielectric layer, the first dielectric layer fills the trench in the substrate and the isolation structure, and a top surface of the first dielectric layer, a bottom surface of the second dielectric layer and a top surface of the isolation structure are aligned with each other;

removing portions of the gate structure to form a plurality of recesses separated from each other;

forming a dielectric structure in each recess; and replacing the sacrificial gate with a metal gate after the forming of the dielectric structure in the recess, wherein a top surface of the gate structure, top surfaces of the dielectric structures and a top surface of the metal gate are aligned with each other.

16. The method of claim 15, wherein the gate structure has a planar surface lower than the top surface of the metal gate.

17. The method of claim 15, wherein the gate structure comprise a plurality of first segments extended in a first direction, and a pair of second segments extended in a second direction, and the pair of second segments are disposed at two ends of each first segment.

18. The method of claim 17, wherein the first segments are separated from each other by the dielectric structures.

19. The method of claim 17, wherein at least one of the pair of second segments overlaps the isolation structure.

20. The method of claim 17, further comprising forming a contact structure coupled to one of the pair of second segments.

* * * * *